United States Patent
Hong et al.

(10) Patent No.: US 11,444,036 B2
(45) Date of Patent: Sep. 13, 2022

(54) POWER MODULE ASSEMBLY

(71) Applicant: Delta Electronics (Shanghai) Co., Ltd., Shanghai (CN)

(72) Inventors: Shouyu Hong, Shanghai (CN); Yan Tong, Shanghai (CN); Weicheng Zhou, Shanghai (CN); Dongfang Lian, Shanghai (CN); Haiyang Cao, Shanghai (CN); Haibin Xu, Shanghai (CN); Tao Wang, Shanghai (CN); Yicong Xie, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 107 days.

(21) Appl. No.: 17/155,956

(22) Filed: Jan. 22, 2021

(65) Prior Publication Data

US 2021/0175184 A1    Jun. 10, 2021

Related U.S. Application Data

(63) Continuation-in-part of application No. 16/502,175, filed on Jul. 3, 2019.

(30) Foreign Application Priority Data

Jul. 18, 2018  (CN) .......................... 201810790118.7
Jan. 23, 2019  (CN) .......................... 201910064451.4
(Continued)

(51) Int. Cl.
*H05K 1/14*   (2006.01)
*H01L 23/538*   (2006.01)
(Continued)

(52) U.S. Cl.
CPC .......... *H01L 23/552* (2013.01); *H01L 23/367* (2013.01); *H01L 23/5223* (2013.01);
(Continued)

(58) Field of Classification Search
CPC ...... H05K 1/0296; H05K 1/145; H05K 1/141; H05K 7/1432; H05K 7/1457;
(Continued)

(56) References Cited

U.S. PATENT DOCUMENTS 10,096,562 B2 * 10/2018 Liang ...................... H01L 25/18
10,658,324 B2 *  5/2020 Murata .................. H01L 24/30
(Continued)

FOREIGN PATENT DOCUMENTS

CN     102882385 B     9/2015
CN     106256082 A    12/2016
(Continued)

*Primary Examiner* — Hoa C Nguyen
(74) *Attorney, Agent, or Firm* — Kirton McConkie; Evan R. Witt

(57) ABSTRACT

A power module assembly is disclosed and includes a package body, a first wiring layer, a capacitor, and a system bus set. The package body includes a first surface, a second surface and two switches connected in series to form a bridge arm between the first surface and the second surface. The first wiring layer is disposed on the first surface. The capacitor is connected in parallel with the bridge arm to form a first high-frequency loop. The system bus set includes a positive-electrode bus and a negative-electrode bus fanned out from the first surface, respectively. The projection of the positive-electrode bus or/and the negative-electrode bus on the first surface is at least partially overlapped with the projection of the two switches on the first surface. The bridge arm is electrically connected between the positive-electrode bus and the negative-electrode bus to form a second high-frequency loop.

20 Claims, 43 Drawing Sheets

(30) Foreign Application Priority Data

Apr. 22, 2019 (CN) .......................... 201910323836.8
Aug. 12, 2020 (CN) .......................... 202010806375.2

(51) Int. Cl.

| | | |
|---|---|---|
| H01L 23/552 | (2006.01) | |
| H01L 23/66 | (2006.01) | |
| H01L 23/522 | (2006.01) | |
| H01L 23/367 | (2006.01) | |
| H01L 23/528 | (2006.01) | |
| H01L 25/18 | (2006.01) | |

(52) U.S. Cl.
CPC ...... *H01L 23/5283* (2013.01); *H01L 23/5286* (2013.01); *H01L 23/66* (2013.01); *H01L 25/18* (2013.01)

(58) Field of Classification Search
CPC ............... H05K 7/1482; H05K 7/1492; H05K 13/0885; H05K 2201/093–09345; H01L 23/5385; H01L 23/66
See application file for complete search history.

(56) References Cited

U.S. PATENT DOCUMENTS

| | | | |
|---|---|---|---|
| 2006/0151874 A1* | 7/2006 | Milich | H01L 25/16 257/713 |
| 2008/0054425 A1* | 3/2008 | Malhan | H01L 24/01 257/E25.016 |
| 2010/0230800 A1 | 9/2010 | Beaupre et al. | |
| 2012/0300522 A1 | 11/2012 | Tokuyama et al. | |
| 2013/0015495 A1 | 1/2013 | Hauenstein | |
| 2013/0271941 A1* | 10/2013 | Guan | H05K 7/1432 361/811 |
| 2014/0008781 A1* | 1/2014 | Nishi | H05K 7/1432 257/691 |
| 2014/0077354 A1 | 3/2014 | Yamamoto et al. | |
| 2014/0346676 A1 | 11/2014 | Horio et al. | |
| 2015/0201495 A1* | 7/2015 | Kim | H05K 1/141 174/255 |
| 2015/0243640 A1 | 8/2015 | Horio et al. | |
| 2017/0148770 A1 | 5/2017 | Ishino et al. | |
| 2018/0059749 A1 | 3/2018 | Chen et al. | |
| 2018/0102301 A1 | 4/2018 | Jeon et al. | |
| 2021/0120676 A1* | 4/2021 | Clavette | H01L 23/5389 |

FOREIGN PATENT DOCUMENTS

| | | |
|---|---|---|
| CN | 106463501 A | 2/2017 |
| CN | 107155372 A | 9/2017 |
| CN | 107393901 A | 11/2017 |
| CN | 207165543 U | 3/2018 |
| CN | 109428498 A | 3/2019 |
| CN | 106971992 B | 4/2019 |
| EP | 3104411 A1 | 12/2016 |
| EP | 3226294 A1 | 10/2017 |
| EP | 3343746 A1 | 7/2018 |
| EP | 3416189 A1 | 12/2018 |
| JP | 2004214452 A | 7/2004 |
| JP | WO2013118415 A1 | 5/2015 |
| JP | 2016162777 A | 9/2016 |
| WO | 2016035651 A1 | 3/2016 |
| WO | 2016038955 A1 | 3/2016 |
| WO | 2017138414 A1 | 8/2017 |
| WO | 2017205730 A1 | 11/2017 |
| WO | 2018011969 A1 | 1/2018 |

* cited by examiner

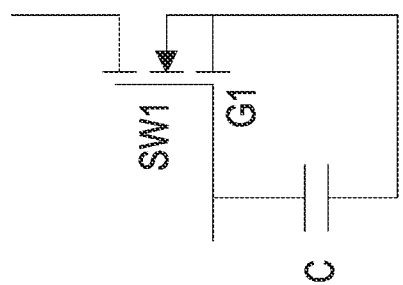

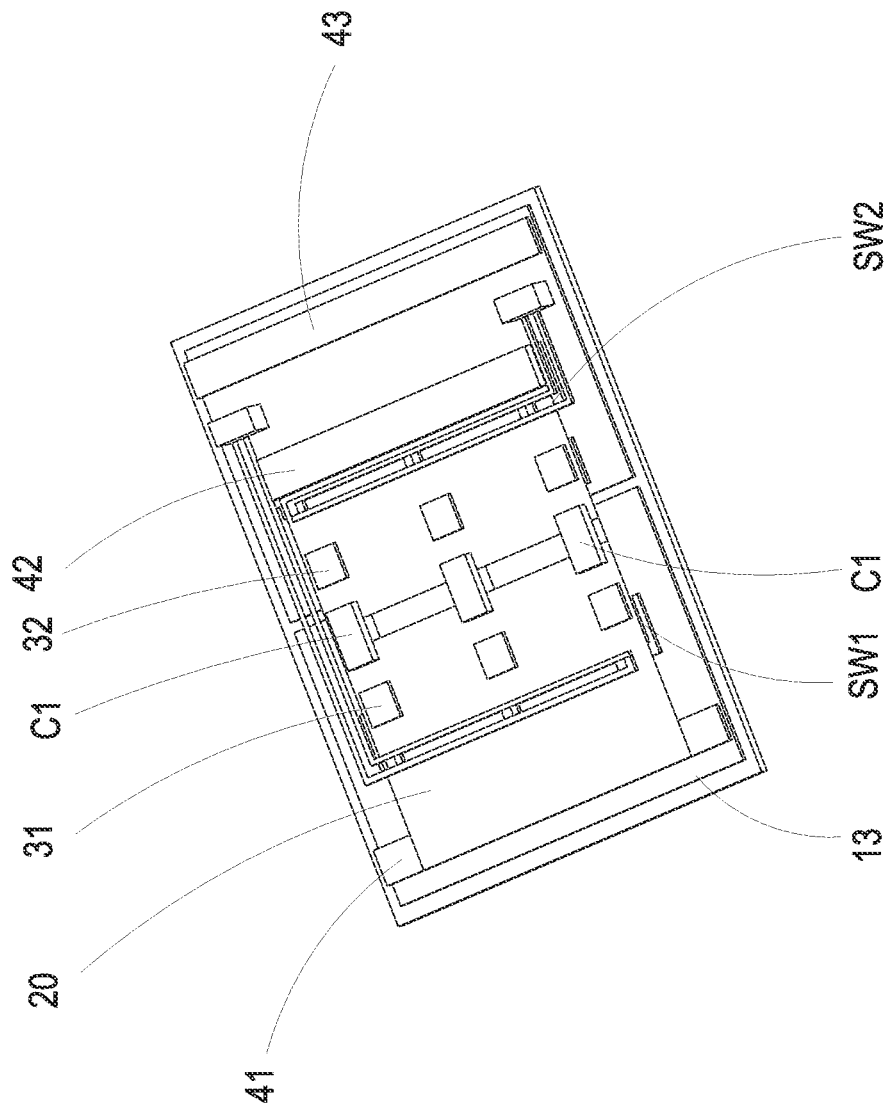

POWER MODULE ASSEMBLY

CROSS-REFERENCE TO RELATED APPLICATION

This application claims priority to China Patent Application No. 202010806375.2, filed on Aug. 12, 2020. This application is a continuation-in-part application of U.S. application Ser. No. 16/502,175 filed on Jul. 3, 2019, and entitled "POWER MODULE STRUCTURE". The entire contents of the above-mentioned patent applications are incorporated herein by reference for all purposes.

FIELD OF THE INVENTION

The present disclosure relates to the field of power electronics, and more particularly to a power module assembly.

BACKGROUND OF THE INVENTION

As an important part of power conversion, modern power electronic equipment is widely used in the power, electronics, motor and energy industries. To ensure long-term stable operation of power electronic equipment and improve power conversion efficiency of power electronic equipment has been an important goal of those skilled in the art.

As the core component of modern power electronic equipment, power semiconductor devices directly determine the reliability and power conversion efficiency of power electronic equipment. In order to design a reliable, safe, and high-performance power electronic equipment, it is desirable that the power semiconductor device has low voltage stress and low power loss. Power semiconductor devices used in power electronic equipment operate in a switching mode, and high frequency switching will induce a high current change rate di/dt. Therefore, a voltage Vs is caused by the changed current applied on the stray inductance Ls and is calculated as follows.

$$Vs = Ls \times \frac{di}{dt}$$

Therefore, a higher voltage spike is caused by larger stray inductance when the current change rate keeps constant. The voltage spike will reduce the reliability of the device and increase turn-off-loss of the device. The device is allowed to switch faster with smaller gate resistance as the loop stray inductance is reduced, which results in lower switching loss and higher efficiency of the converter.

At the same time, due to the unavoidable presence of parasitic inductance in the power loop, the high switching frequency of the power device causes a rapid voltage change, which will cause the EMI in the circuit to exceed the standard.

Therefore, there is a need of providing a power module assembly to obviate the drawbacks encountered by the prior arts and achieve the purpose of reducing the parasitic inductance and the EMI.

SUMMARY OF THE INVENTION

An object of the present disclosure is to provide a power module assembly. By optimizing the arrangement of each component, the purpose of reducing the parasitic inductance and the EMI is achieved. It facilitates the power module assembly to be assembled easily and firmly. At the same time, it is beneficial to reduce the volume of the power module and improve the entire power density of the power module.

Another object of the present disclosure is to provide a power module assembly. Two switches are connected in series to form a bridge arm embedded in a package body. By partially overlapping the projection of a system bus set on the surface of the package body and the projection of the two series-connection switches on the surface of the package body, a first high-frequency loop and a second high-frequency loop decoupled from each other are formed. The current of the first high-frequency circuit flows through the first wiring layer on the surface of the package body. However, the current path of the second high-frequency circuit crosses through the first wiring layer on the surface of the package body, and its current that flows through the first wiring layer in the horizontal direction can be ignored. At least, the current paths of the two high-frequency circuits are partially decoupled, and the interaction with each other is eliminated. Furthermore, the first wiring layer on the surface of the package body can be realized with a thinner thickness, and the package body can be assembled with the system bus set to reduce the manufacturing costs, minimize the thickness of the entire structure. Moreover, the filling effect of the insulation material layer in the package body is improved, and the reliability of the product is enhanced. In addition, when the capacitor of the power module assembly is directly arranged outside the package body, it is beneficial for simplifying the assembly structure, reducing the cost, simplifying the manufacturing process, and improving the yield and reliability of the product.

A further object of the present disclosure is to provide a power module assembly. By partially overlapping the projection of the system bus set on the surface of the package body and the projection of the two series-connection switches on the surface of the package body, the first high-frequency loop and the second high-frequency loop formed in the power module assembly are decoupled from each other, and the parasitic inductances of the first high-frequency loop and the second high-frequency loop are eliminated. It is easy to realize the connection process between the system bus set and the bridge arm composed of the two series-connection switches. It is beneficial for reducing the cost and enhancing the reliability. A better shielding for the control circuit on the system side is provided by the system bus set, and it facilitates the power module assembly to avoid the EMI. Moreover, since the system bus set is fanned out on the same side of the power module assembly, and assembled with the bridge arm composed of two series-connection switches, it facilities the power module assembly to combine with two heat dissipation modules to achieve the double-sided heat dissipation and reduce the thermal resistance. Furthermore, the purposes of reducing the costs, enhancing the reliability of the power module and improving the heat-dissipation capacity are achieved.

In accordance with an aspect of the present disclosure, there is provided a power module assembly. The power module assembly includes a package body, a first wiring layer, a capacitor and a system bus set. The package body includes a first surface, a second surface, a first switch and a second switch. The first surface and the second surface are opposite to each other, and the first switch and the second switch are embedded between the first surface and the second surface and connected to each other in series to form a bridge arm. The first wiring layer is disposed on the first surface of the package body. The capacitor is connected in parallel with the bridge arm to form a first high-frequency loop. The system bus set includes a positive-electrode bus and a negative-electrode bus fanned out from the first surface of the package body, respectively. A projection of the positive-electrode bus or/and the negative-electrode bus on the first surface is at least partially overlapped with a projection of the first switch or/and the second switch on the first surface, and the projection of the positive-electrode bus or/and the negative-electrode bus on the first surface is at least partially overlapped with a projection of the capacitor on the first surface, wherein the bridge arm is electrically connected between the positive-electrode bus and the negative-electrode bus to form a second high-frequency loop.

The above contents of the present disclosure will become more readily apparent to those ordinarily skilled in the art after reviewing the following detailed description and accompanying drawings, in which:

BRIEF DESCRIPTION OF THE DRAWINGS

FIG. 5C shows a third example of a clamping circuit formed by the driving component corresponding to the first switch;

FIG. 8 is a perspective view illustrating a partial structure of the power module assembly according to the second embodiment of the present disclosure;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
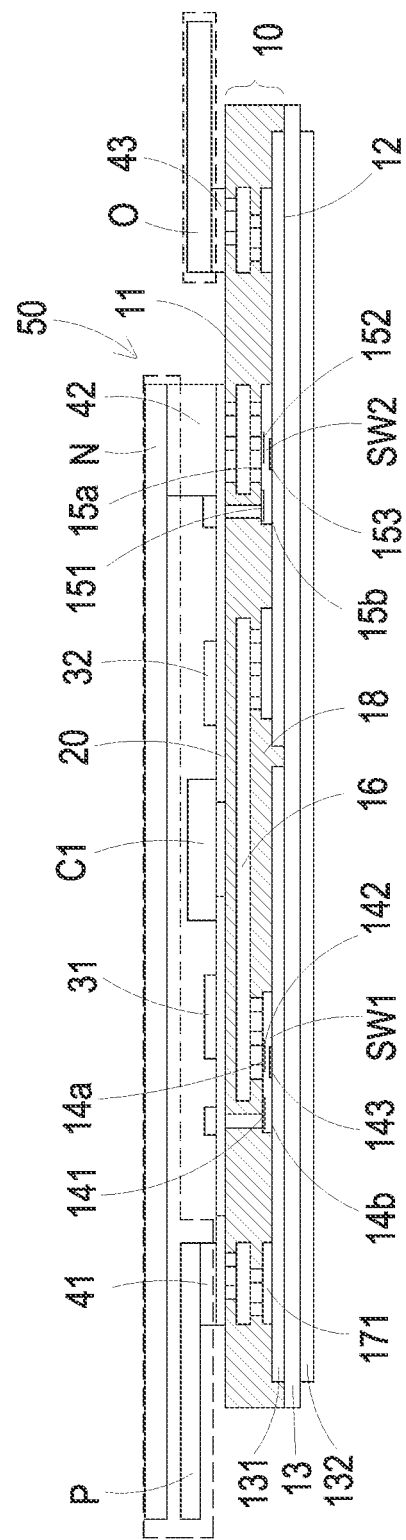
FIG. 1 is a schematic cross-sectional view illustrating a power module assembly according to a first embodiment of the present disclosure.
Figure 2:
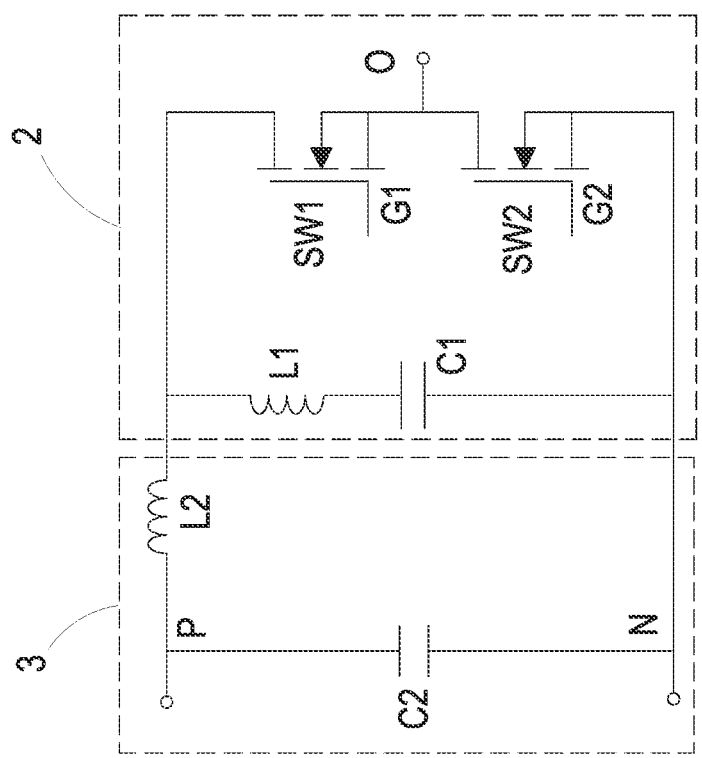
FIG. 2 is an equivalent circuit diagram showing the power module assembly of the present disclosure.

FIG. 1 is a schematic cross-sectional view illustrating a power module assembly according a first embodiment of the present disclosure. FIG. 2 is an equivalent circuit diagram showing the power module assembly of the present disclosure. In the embodiment, the power module assembly 1 is for example but not limited to an assembly structure of an embedded power module and a system end connected thereto. The power module assembly 1 includes package body 10, a first wiring layer 20, a capacitor C1 and a system bus set 50. The package body 10 includes a first surface 11, a second surface 12, a first switch SW1 and a second switch SW2. The first surface 11 and the second surface 12 are opposite to each other. In the embodiment, the first switch SW1 and the second switch SW2 are embedded between the first surface 11 and the second surface 12, and connected to each other in series to form a bridge arm. The first wiring layer 20 is disposed on the first surface 11 of the package body 10. The capacitor C1 is disposed on the first wiring layer 20. Moreover, the capacitor C1 disposed on the first wiring layer 20 is connected in parallel with the bridge arm composed of the first switch SW1 and the second switch SW2 through the first wiring layer 20, to form a first high-frequency loop. In addition, the system bus set 50 includes a positive-electrode bus P and a negative-electrode bus N, which are fanned out from the first surface 11 of the package body 10, respectively. A projection of the positive-electrode bus P or/and the negative-electrode bus N on the first surface 11 is at least partially overlapped with a projection of the first switch SW1 or/and the second switch SW2 on the first surface 11, and the projection of the positive-electrode bus P or/and the negative-electrode bus N on the first surface 11 is at least partially overlapped with a projection of the capacitor C1 on the first surface 11. In the embodiment, the bridge arm composed of the first switch SW1 and the second switch SW2 is electrically connected between the positive-electrode bus P and the negative-electrode bus N to form a second high-frequency loop.

In the embodiment, the power module assembly 1 includes a substrate 13. The substrate 13 includes a second wiring layer 131, and the second wiring layer 131 is disposed in the package body 10. The first switch SW1 and the second switch SW2 connected to each other in series are disposed on the second wiring layer 131 to form the bridge arm. Preferably but not exclusively, the first switch SW1 and the second switch SW2 are MOSFET (Metal-Oxide-Semiconductor Field Effect Transistor), IGBT (Insulated Gate Bipolar Transistor), BJT (Bipolar Junction Transistor) or other types of switches. In the embodiment, the substrate 13 can be for example but not limited to the DBC substrate (Direct Bonded Copper substrate), the AMB substrate (Active Metal Brazing substrate), the LTCC substrate (Low Temperature Co-fired Ceramic substrate), the HTCC substrate (High Temperature Co-fired Ceramic substrate) or IMS (Insulated Metal Substrate), which includes the second wiring layer 131 and an additional wiring layer 132 disposed on two opposite sides. In addition, preferably but not exclusively, the first switch SW1 and the second switch SW2 are both vertical devices. The first switch SW1 includes a first side 14a, a second side 14b, a first end 141, a second end 142 and a third end 143. The first side 14a and the second side 14b are opposite to each other. The first end 141 and the second end 142 are disposed on the first side 14a, and the third end 143 is disposed on the second side 14b. The second switch SW2 includes a first side 15a, a second side 15b, a first end 151, a second end 152 and a third end 153. The first side 15a and the second side 15b are opposite to each other. The first end 151 and the second end 152 are disposed on the first side 15a, and the third end 153 is disposed on the second side 15b. In the embodiment, the second end 142 of the first switch SW1 is electrically connected to the third end 153 of the second switch SW2. Taking MOSFET as an example, the first ends 141, 151 represent the gate, the second ends 142, 152 represent the source, and the third ends 143, 153 represent the drain.

In the embodiment, the package body 10 further includes a third wiring layer 16 disposed between the first surface 11 and the first switch SW1 and between the first surface 11 and the second switch SW2. Moreover, the second end 142 of the first switch SW1 is electrically connected to the third end 153 of the second switch SW2 through the third wiring layer 16. Preferably but not exclusively, the thickness of the third wiring layer 16 is greater than the first wiring layer 20. The package body 10 includes a conductive structure 171, which is configured for the electrical connection in the package body 10. In the embodiment, the first switch SW1, the second switch SW2, the third wiring layer 16 and the conductive structure 171 disposed on the substrate 13 are covered by an insulation-material layer 18, so as to form the structure of the package body 10. The first switch SW1 and the second switch SW2 are embedded between the first surface 11 and the second surface 12. Certainly, the present disclosure is not limited thereto.

Notably, the area framed by the dashed line in FIG. 1 is the system bus set 50, which is used to connect the first switch SW1 and the second switch SW2 to the system end. In the embodiment, the system bus set 50 further includes an output bus O, which is electrically connected to a midpoint of the bridge arm including the first switch SW1 and the second switch SW2. Moreover, the output bus is fanned out from the first surface 11 of the package body 10. In the embodiment, the power module assembly 1 includes a positive-electrode extension part 41, a negative-electrode extension part 42 and an output extension part 43. The positive-electrode extension part 41, the negative-electrode extension part 42 and the output extension part 43 are disposed on the first surface 11 of the package body 10, and configured to connect to the positive-electrode bus P, the negative-electrode bus N and the output bus O, respectively. In other words, the top ends of the positive-electrode extension part 41, the negative-electrode extension part 42 and the output extension part 43 are corresponding and directly connected to the positive-electrode bus P, the negative-electrode bus N and the output bus O of the system bus set 50. Notably, the projection of the positive-electrode bus P or/and the negative-electrode bus N on the first surface 11 is at least partially overlapped with the projection of the first switch SW1 or/and the second switch SW2 on the first surface 11. In addition, the positive-electrode bus P and the negative-electrode bus N are parallel to each other and at least partially overlapped to be fanned out from the same side of the power module assembly 1. In the embodiment, the output bus O is fanned out from another side of the power module assembly 1. In other embodiment, the output bus O is fanned out in parallel with the positive-electrode bus P or the negative-electrode bus N from the same side.

On the other hand, the area 2 framed by the dashed line in FIG. 2 includes the first switch SW1 and the second switch SW2 connected to each other in series to form the bridge arm. The output bus O is connected to the midpoint of the bridge arm. Moreover, the inductance L1 is connected to the capacitor C1 in series, and is further connected to the aforementioned bridge arm in parallel. In the embodiment, the first switch SW1 and the second switch SW2 can be for example but not limited to the MOSFET. In the FIG. 2, the first end of the first switch SW1 and the first end of the second switch SW2 are served as a gate electrode G1 and a gate electrode G2, respectively. Certainly, in other embodiments, the first switch SW1 and the second switch SW2 are other types of switches, such as IGBT, BJT, etc. The present disclosure is not limited thereto. In addition, as shown in FIG. 2, the inductance L1 is a parasitic inductance on the corresponding connection path in the power module assembly 1. There is another area 3 framed by the dashed line in FIG. 2. The area 3 corresponds to the connection of the system bus set 50, the area framed by the dashed line in FIG. 1, with the system end. The area 3 framed by the dashed line further includes an inductance L2, which is a parasitic inductance. Preferably but not exclusively, the inductance L2 is connected to the circuit of area 2 in series, and further connected to a capacitor C2 in parallel. The inductance L2 is a parasitic inductance on the corresponding connection path of the system bus set 50 in the power module assembly 1. Preferably but not exclusively, the capacitor C2 is a system-end capacitor (referring to FIGS. 30A to 30C). The present disclosure is not limited thereto. In the embodiment, the first high-frequency loop and the second high-frequency loop described in FIG. 1 are formed and presented in FIG. 2. The first high-frequency loop includes the inductance L1, the first switch SW1 and the second switch SW2, and the inductance L1 is the parasitic inductance of the first high-frequency loop. The second high-frequency loop includes the inductance L2, the first switch SW1 and the second switch SW2, and the inductance L2 is the parasitic inductance of the second high-frequency loop.

Figure 3:
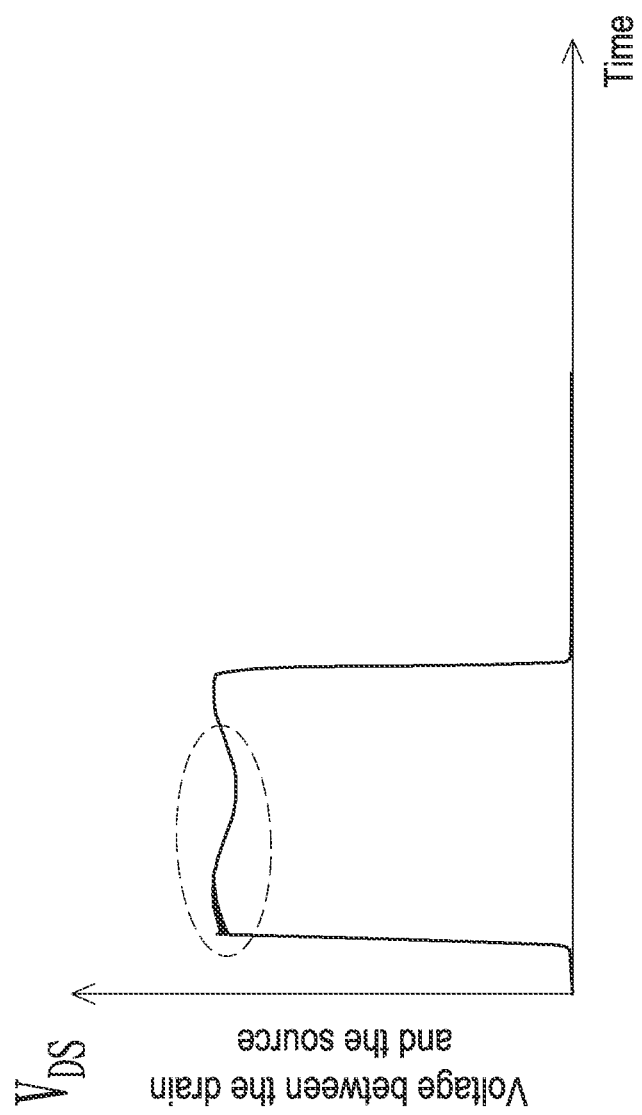
FIG. 3 is a diagram showing voltage waveforms between the drain and the source of the second switch in FIG. 2.
Figure 4:
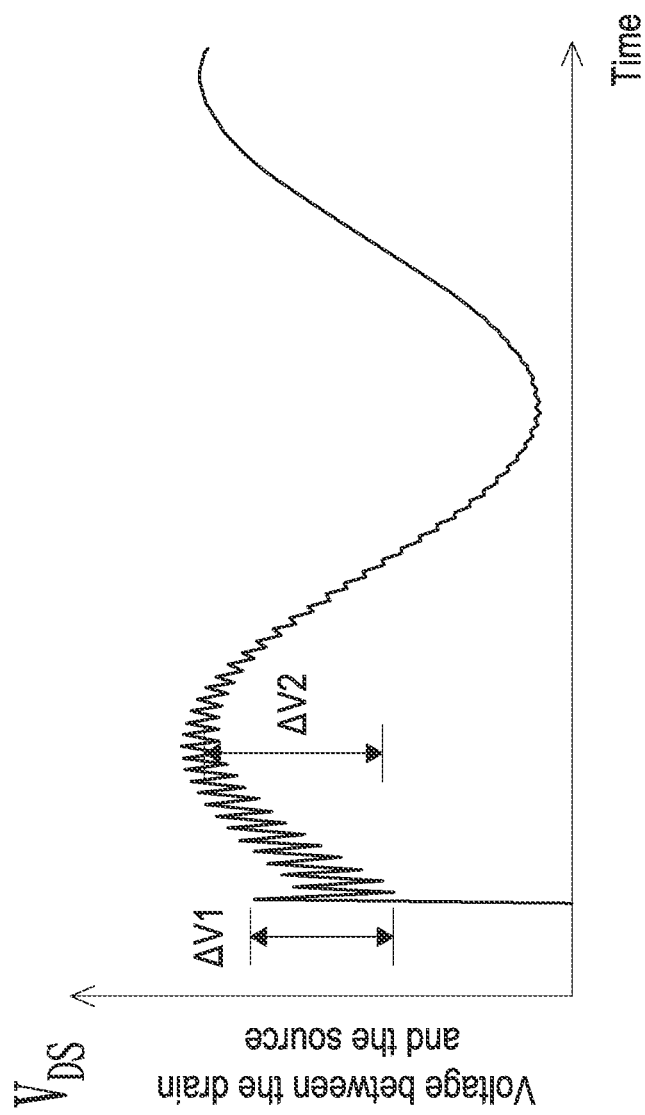
FIG. 4 is an enlarged view of the portion circled in FIG. 3.

Preferably but not exclusively, the first switch SW1 and the second switch SW2 are MOSFET switches. FIG. 3 is a diagram showing voltage waveforms between the drain and the source of the second switch in FIG. 2. FIG. 4 is an enlarged view of the portion circled in FIG. 3. The corresponding waveform of the first switch SW1 is similar to that of the second switch SW2, but the phase is different. In the embodiment, the voltage level VDS between the drain and source of the second switch SW2 contains two components. The first component is the first voltage spike $\Delta V1$ generated after the second switch SW2 is turned off. It has a high frequency and the voltage level is relevant to the inductance L1 shown in FIG. 2. As the inductance L1 is smaller, the first voltage spike $\Delta V1$ is smaller. In addition, a voltage component $\Delta V2$ with a slightly lower frequency is contained in the voltage level VDS of FIG. 2. Certainly, the frequency of the voltage component $\Delta V2$ is still higher than the switching frequency of the second switch SW2. The level of the voltage component $\Delta V2$ is relevant to the inductance L2 shown in FIG. 2. As the inductance L2 is smaller, the voltage component $\Delta V2$ is smaller.

Furthermore, in the embodiment, the power module assembly 1 includes not only the capacitor C1 but also two driving components 31, 32 disposed on the first wiring layer 20. Preferably but not exclusively, the driving component 31 is disposed on the first wiring layer 20 and electrically connected to the first end 141 and the second end 142 of the first switch SW1 so as to receive a control signal and output a driving signal for controlling the first switch SW1. The driving component 32 is disposed on the first wiring layer 20 and electrically connected to the first end 151 and the second end 152 of the second switch SW2 so as to receive a control signal and output a driving signal for controlling the second switch SW2. The capacitor C1 and the two driving components 31, 32 are electrically connected to the first switch SW1 and the second switch SW2 through the first wiring layer 20. Preferably but not exclusively, the two driving components 31, 32 are driving circuits configured to drive the first switch SW1 and the second switch SW2, respectively. The corresponding clamping circuit for driving is described with the first switch SW1 such as a MOSFET and the driving component 31 in the following.

Figure 5A:
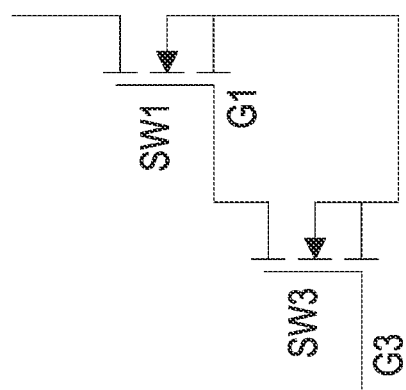
FIG. 5A shows a first example of a clamping circuit formed by the driving component corresponding to the first switch.

FIG. 5A shows a first example of a clamping circuit formed by the driving component corresponding to the first switch. In the embodiment, the driving component 31 includes a third switch SW3. Preferably but not exclusively, the third switch SW3 is electrically connected between the gate G1 and the source of the first switch SW1. The drain of the third switch SW3 and the gate G1 of the first switch SW1 are connected together. The source of the third switch SW3 is connected to the source of the first switch SW1. In that, the driving component 31 forms the clamping circuit between the gate G1 and the source of the first switch SW1 for clamping.

Figure 5B:
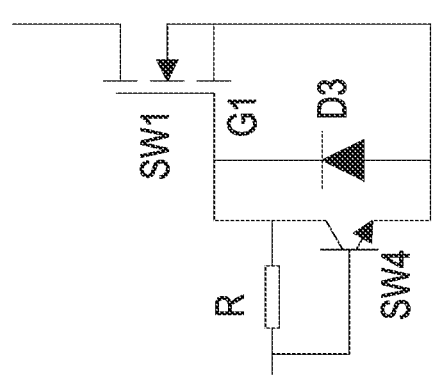
FIG. 5B shows a second example of a clamping circuit formed by the driving component corresponding to the first switch.

FIG. 5B shows a second example of a clamping circuit formed by the driving component corresponding to the first switch. In the embodiment, the driving component 31 includes a fourth switch SW4 and a diode D3. Preferably but not exclusively, the fourth switch SW4 and the diode D3 are connected between the gate G1 and the source of the first switch SW1. In the embodiment, the fourth switch SW4 is for example a triode. The diode D3 is connected between the collector and the emitter of the fourth switch SW4. In addition, the driving component 31 further includes a resistor R connected between the base and the collector of the fourth switch SW4. In that, the driving component 31 forms the clamping circuit between the gate G1 and the source of the first switch SW1 for clamping.

FIG. 5C shows a third example of a clamping circuit formed by the driving component corresponding to the first switch. In the embodiment, the driving component 31 includes a capacitor C. Preferably but not exclusively, the capacitor C is connected between the gate G1 and the source of the first switch SW1. In that, the driving component 31 forms the clamping circuit between the gate G1 and the source of the first switch SW1 for clamping. Certainly, the clamping circuit in the present disclosure is provided for demonstration purposes. The present disclosure is not limited thereto.

Figure 6A:
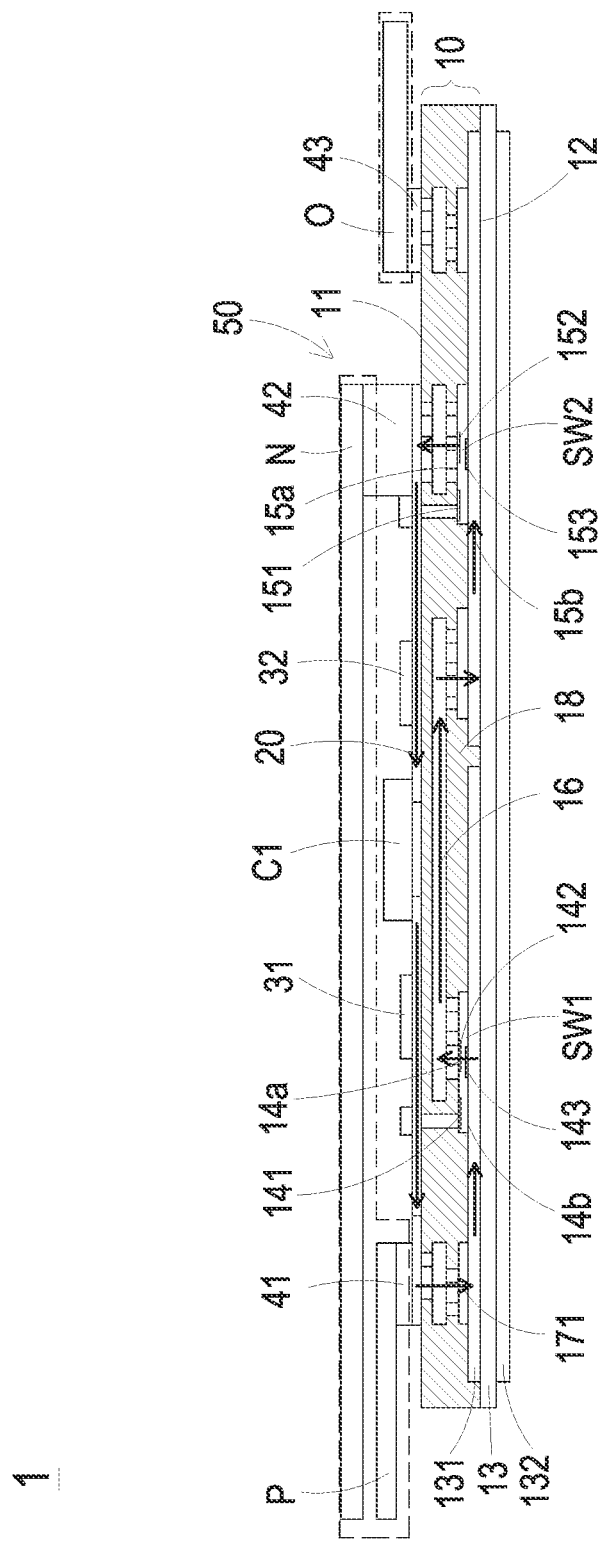
FIG. 6A is a schematic cross-sectional view illustrating the current flow of the first high-frequency loop of the power module assembly according to the first embodiment of the present disclosure.
Figure 6B:
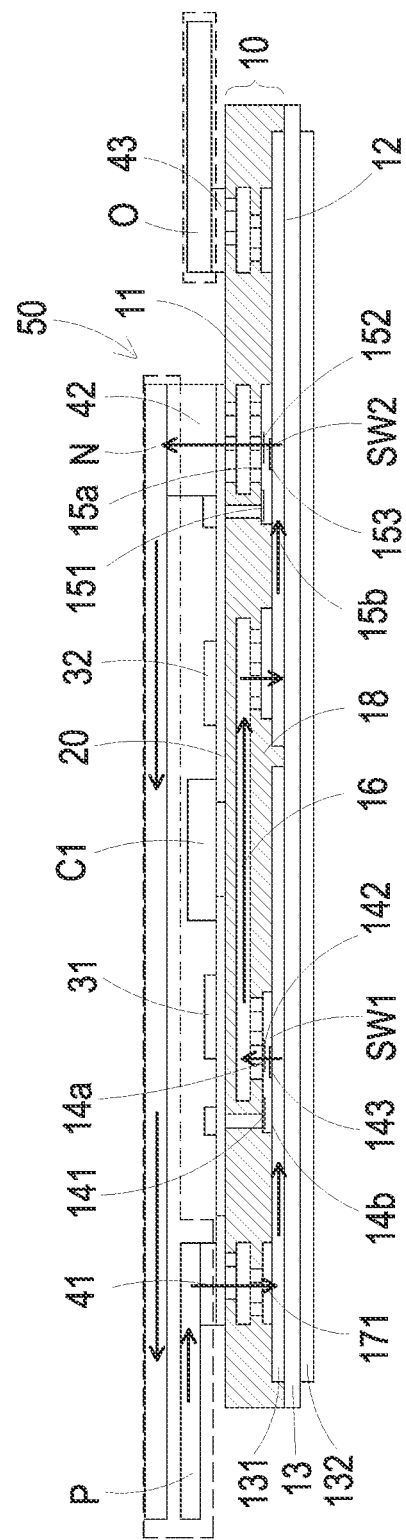
FIG. 6B is a schematic cross-sectional view illustrating the current flow of the second high-frequency loop of the power module assembly according to the first embodiment of the present disclosure.

In the embodiment, the first high-frequency loop and the second high-frequency loop formed in the power module assembly 1 can be for example but not limited to a clamp-circuit-current loop and a main-power-current loop, respectively. FIG. 6A is a schematic cross-sectional view illustrating the current flow of the first high-frequency loop of the power module assembly according to the first embodiment of the present disclosure. FIG. 6B is a schematic cross-sectional view illustrating the current flow of the second high-frequency loop of the power module assembly according to the first embodiment of the present disclosure. In FIG. 6A, the flow of the high-frequency current of the first high-frequency loop is indicated by the arrow. It flows from the first wiring layer 20, through the third wiring layer 16, the substrate 13, the first switch SW1, the third wiring layer 16, the substrate 13, the second switch SW2, the third wiring layer 16, and then back to the first wiring layer 20. In the embodiment, the first switch SW1, the second switch SW2 and a conductive structure 171 are disposed on the surface of the substrate 13. The second end 142 of the first switch SW1 and the third end 153 of the second switch SW2 are electrically connected through the third wiring layer 16. In the embodiment, the first wiring layer 20 is disposed on the first surface 11 of the package body 10, and the thickness of the first wiring layer 20 is less than the thickness of the third wiring layer 16.

In addition, as shown in FIG. 6B, the flow of the high-frequency current of the second high-frequency loop is indicated by the arrow. It flows from the positive-electrode bus P, through the positive-electrode extension part 41, the first wiring layer 20, the third wiring layer 16, the substrate 13, the first switch SW1, the third wiring layer 16, the substrate 13, the second switch SW2, the third wiring layer 16, the first wiring layer 20, the negative-electrode extension part 42 and then flows out of the negative-electrode bus N.

Notably, in the embodiment, the positive-electrode bus P and the negative-electrode bus N are parallel to each other, and the projection of the positive-electrode bus P and the negative-electrode bus N on the first surface 11 of the package body 10 is at least partially overlapped with the projection of the first switch SW1 and the second switch SW2 on the first surface 11. Thus, the area enclosed by the second high-frequency loop is relatively small, and the parasitic inductance L2 in FIG. 2 is relatively small. Consequently, the voltage stress on the first switch SW1 and the second switch SW2 is reduced.

In addition, as shown in FIG. 6B, the current of the second high-frequency loop crosses through the first wiring layer 20, and the part of the current flowing through the first wiring layer 20 in the horizontal direction can be ignored. Therefore, the current of the second high-frequency loop and the current of the first high-frequency loop are at least partially decoupled, and the mutual influence is eliminated. Because of the separation of the first high-frequency loop and the second high-frequency loop, the second high-frequency loop such as the main power current loop is not transmitted through the first wiring layer 20. Therefore, the first wiring layer 20 can be thinner. Preferably but not exclusively, the thickness of the first wiring layer 20 is less than 70 μm. It is beneficial for reducing the manufacturing cost and the thickness of the overall structure. Furthermore, the filling of the insulation-material layer 18 of the package body 10 is improved, and the reliability of the product is enhanced. In addition, with such structure, the current path of the second high-frequency loop served as the main power current loop is very smooth, and the impedance of the current path is greatly reduced. Consequently, the loss of the current path is reduced. Moreover, in FIG. 6B, the first wiring layer 20 for the first high-frequency loop is disposed within the envelope space of the second high-frequency loop. According to Lenz's law, the magnetic flux in the envelope space of the second high-frequency loop is partially consumed by the first wiring layer 20, thereby reducing the parasitic inductance L2. Similarly, in FIG. 6A, the arrangement of the second high-frequency loop is helpful to reduce the inductance L1 in the first high-frequency loop.

Furthermore, in the embodiment, the capacitor C1 is disposed on the first wiring layer 20. In FIG. 2, one end of the capacitor C1 is connected to the third end 143 of the first switch SW1, and the other end of the capacitor C1 is connected to the second end 152 of the second switch SW2. The capacitor C1 is served as a decoupling capacitor, which can absorb the high-frequency component of the first high-frequency loop to reduce high frequency oscillation. At the same time, since the capacitor C1 is arranged close to the first switch SW1 and the second switch SW2, the parasitic inductance L1 is smaller. According to the formula: $L_{stray} \times di/dt = V_{spike}$, as the parasitic inductance L1 is smaller, the high-frequency oscillation spike of the voltage across the first switch SW1 and the second switch SW2 is smaller.

In the embodiment, the two driving components 31 and 32 are disposed on the first wiring layer 20. The corresponding driving circuit of the driving component 31 is further shown in FIGS. 5A to 5C. In the embodiment, the clamping circuit of the driving components 31 and 32 is disposed near the first switch SW1 and the second switch SW2, and the circuit formed with the driving electrodes of the first switch SW1 and the second switch SW2 is small. Certainly, the present disclosure is not limited thereto.

Figure 7A:
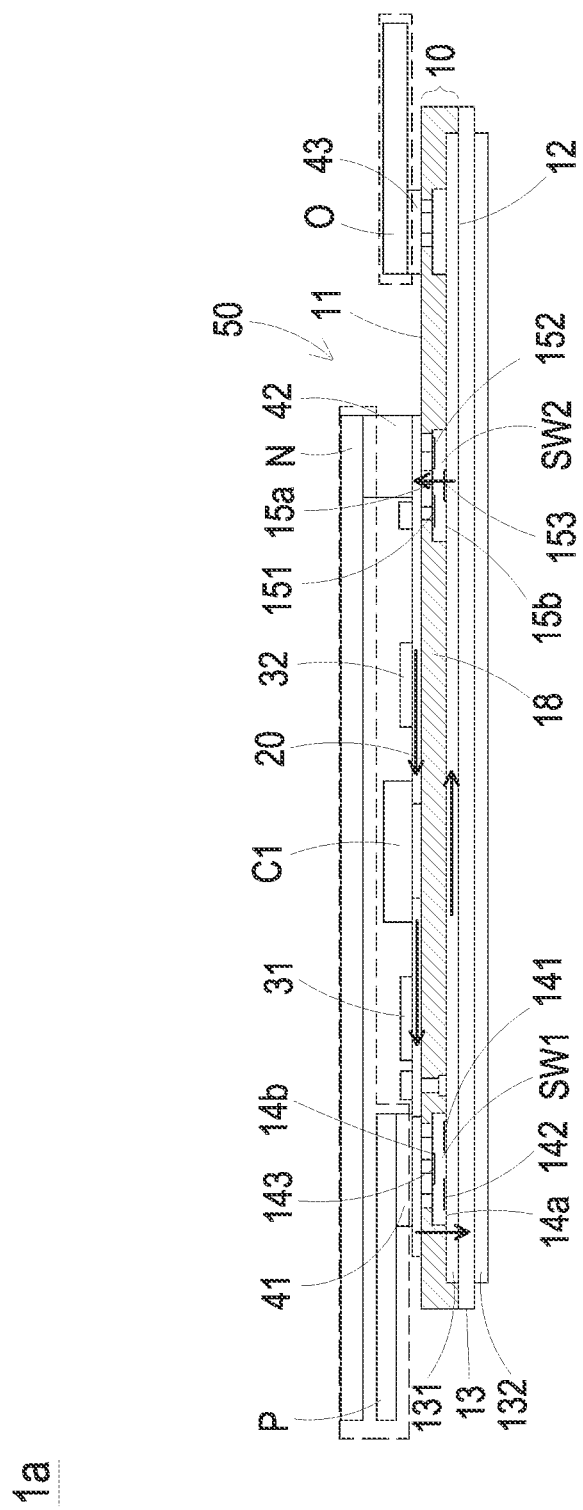
FIG. 7A is a schematic cross-sectional view illustrating the current flow of the first high-frequency loop of the power module assembly according to a second embodiment of the present disclosure.
Figure 7B:
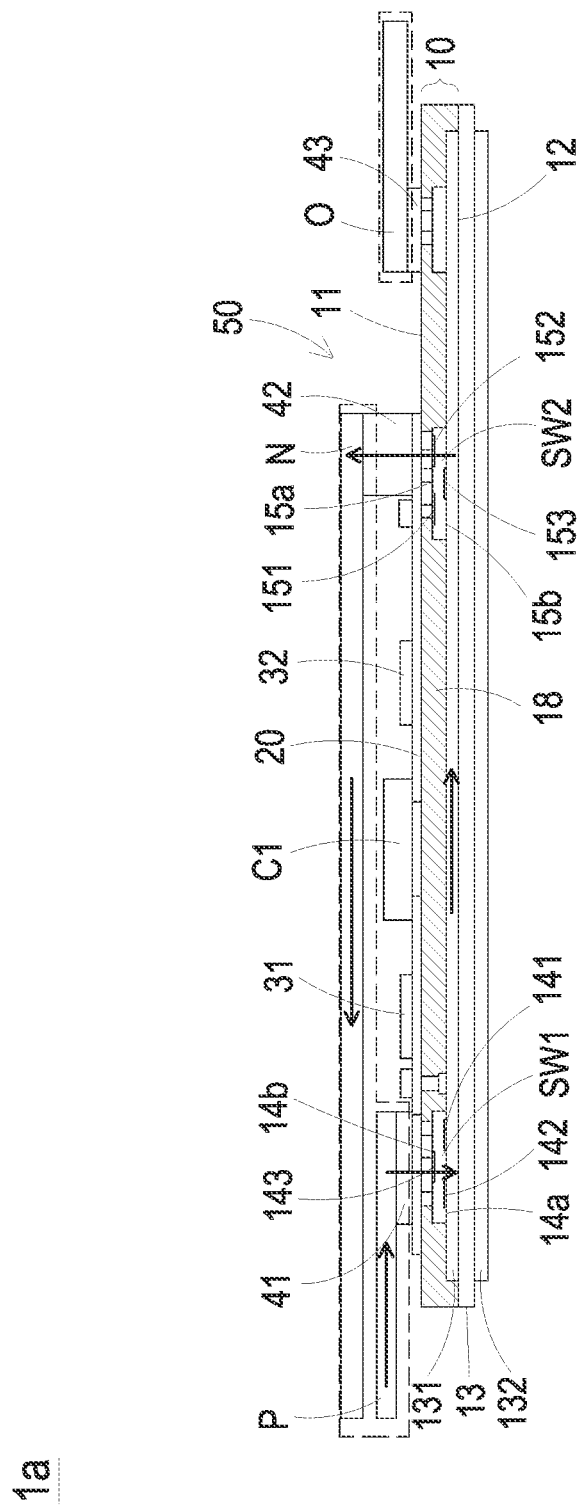
FIG. 7B is a schematic cross-sectional view illustrating the current flow of the second high-frequency loop of the power module assembly according to the second embodiment of the present disclosure.

FIG. 7A is a schematic cross-sectional view illustrating the current flow of the first high-frequency loop of the power module assembly according to a second embodiment of the present disclosure. FIG. 7B is a schematic cross-sectional view illustrating the current flow of the second high-frequency loop of the power module assembly according to the second embodiment of the present disclosure. In the embodiment, the structures, elements and functions of the power module assembly 1a are similar to those of the power module 1 of FIG. 1 and FIGS. 6A and 6B, and are not redundantly described herein. Different from the power module assembly 1 of the first embodiment having the first side 14a of the first switch SW1 and the first side 15a of the second switch SW2 both facing to the first surface 11, in this embodiment, the first side 15a of the second switch SW2 faces to the first surface 11, but the first side 14a of the first switch SW1 faces to the second surface 12. Preferably but not exclusively, the first end 141 of the first switch SW1 and the first end 151 of the second switch SW2 are connected to the first wiring layer 20 through the vias. In this embodiment, the connection of the first switch SW1 and the second switch SW2 shown in FIG. 2 is realized through the second wiring layer 131 on the substrate 13. Compared with the power module assembly 1 shown in FIG. 1, in the embodiment, the third wiring layer 16 (shown in FIG. 1) is omitted in the power module assembly 1a. Thus, it facilitates the power module assembly 1a to reduce the requirement of the number of wiring layers in the package body 10. Consequently, the cost of the overall structure is reduced. At the same time, in terms of the thickness of the power module assembly 1a, the number of wiring layers is decreased to reduce the overall height and increase the power density.

FIG. 8 is a perspective view illustrating a partial structure of the power module assembly according to the second embodiment of the present disclosure. In the embodiment, the signal terminals of the two driving components 31 and 32 are connected to the control-electrode lead-out ports for the first switch SW1 and the second switch SW2 through the connector The connector is a mature connection method in the power electronics industry, and has the advantages of convenience, simplicity and reliability. On the other hand, in the embodiment, the capacitor C1 and the driving components 31 and 32 are disposed on the first wiring layer 20 outside the package body 10 by the surface mount technology (SMT). Since the capacitor C1 and other low-priced, large-quantity, stress-sensitive devices are arranged outside the package body 10, the assembly structure is simplified, and it has the advantages of reducing the cost, simplifying the manufacturing process, and improving the yield and the reliability of the product.

In the embodiment, the first switch SW1 and the second switch SW2 are soldered on the second wiring layer 131 of the substrate 13. The second wiring layer 131 of the substrate 13 is not only used to conduct the current, and but also provides the function of heat-dissipation. The thermal-conduction resistance of the first switch SW1 and the second switch SW2 to the additional wiring layer 132 disposed on another opposite side of the substrate 13 is reduced. Moreover, since the volumetric heat capacity of copper is larger, it is helpful for improving the ability of the first switch SW1 and the second switch SW2 to resist large instantaneous currents. In addition, when the first switch SW1 and the second switch SW2 are disposed on two mutual-independent copper layers, the thermal interaction between the first switch SW1 and the second switch SW2 is eliminated effectively. Thus, the heat dissipation of devices is improved. In the embodiment, the intermediate layer of the substrate 13 includes for example but not limited to ceramic or resin. It ensures that the power module assembly 1a is mounted on the surface of the heat sink directly and the strength support thereof is further enhanced.

In the embodiment, the power module assembly 1a includes a positive-electrode extension part 41, a negative-electrode extension part 42 and an output extension part 43. The positive-electrode extension part 41, the negative-electrode extension part 42 and the output extension part 43 are directly connected to the positive-electrode bus P, the negative-electrode bus N and the output bus O of the system bus set 50 disposed thereabove, correspondingly. Preferably but not exclusively, the connection is realized by laser welding, ultrasonic welding, etc. In the embodiment, the output bus O is further electrically connected to the midpoint of the bridge arm including the first switch SW1 and the second switch SW2, and the output bus O is parallel to the positive-electrode bus P and the negative-electrode bus N. In other embodiments, the projection of the output bus O on the first surface 11 and the projection of the positive-electrode bus P or the negative-electrode bus N on the first surface 11 are at least partially overlapped. Notably, the projection of the positive-electrode bus P or/and the negative-electrode bus N on the first surface 11 and the projection of the first switch SW1 or/and the second switch SW2 on the first surface 11 are at least partially overlapped. Moreover, the positive-electrode bus P and the negative-electrode bus N are fanned out from the same side of the power module assembly 1a. The positive-electrode bus P and the negative-electrode bus N are parallel to each other and at least partially overlapped. With the magnetic field cancellation of the entire loop, the stray inductance, such as the inductance L1 or the inductance L2 in FIG. 2, is greatly reduced. Thus, the voltage stress on the first switch SW1 and the second switch SW2 is reduced, and the reliability of the first switch SW1 and the second switch SW2 is improved. Moreover, the turn-off loss is reduced to improve the efficiency of the converter.

Figure 9:
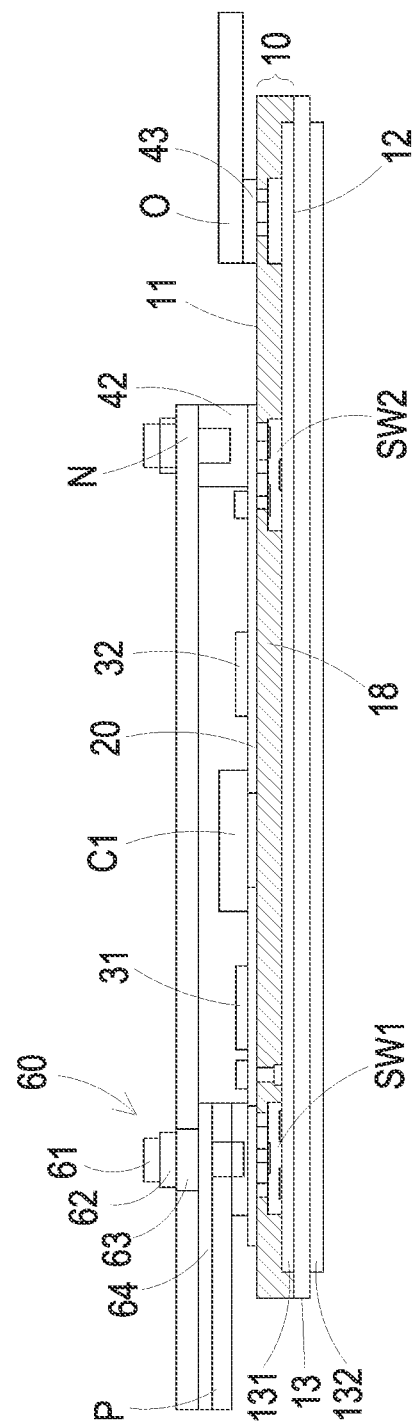
FIG. 9 is an exemplary structure illustrating the connection between the buses and the extension parts in the power module assembly of the present disclosure.

FIG. 9 is an exemplary structure illustrating the connection of the buses and the extension parts in the power module assembly of the present disclosure. In order to fan out the positive-electrode bus P and the negative-electrode bus N parallel to each other on the same side, the connection between the positive-electrode bus P and the positive-electrode extension part 41 and the connection between the negative-electrode bus N and the negative-electrode extension part 42 are connected through the bolt set 60, respectively. Preferably but not exclusively, the conduction is realized through the engagement of the screw 61 and the nut 62. When the bolt set 60 has to penetrate the negative-electrode bus N and conduct to the positive-electrode bus P, an insulation bushing 63 is further used for insulation. Preferably but not exclusively, the positive-electrode bus P and the negative-electrode bus N are further separated by an insulating material layer 64, and the positive-electrode bus P and the negative-electrode bus N are fanned out on the same side and in parallel.

Figure 10:
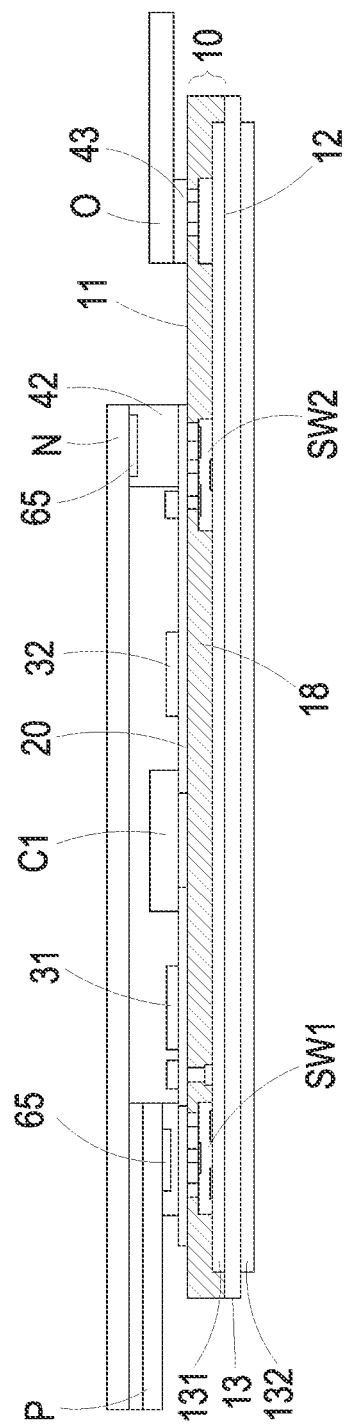
FIG. 10 is another exemplary structure illustrating the connection between the buses and the extension parts in the power module assembly of the present disclosure.

FIG. 10 is another exemplary structure illustrating the connection of the buses and the extension parts in the power module assembly of the present disclosure. The connection between the positive-electrode bus P and the positive-electrode extension part 41 and the connection between the negative-electrode bus N and the negative-electrode extension part 42 are realized by the interference-fit structure 65. The connection method is simple and reliable. The present disclosure is not limited thereto.

Figure 11A:
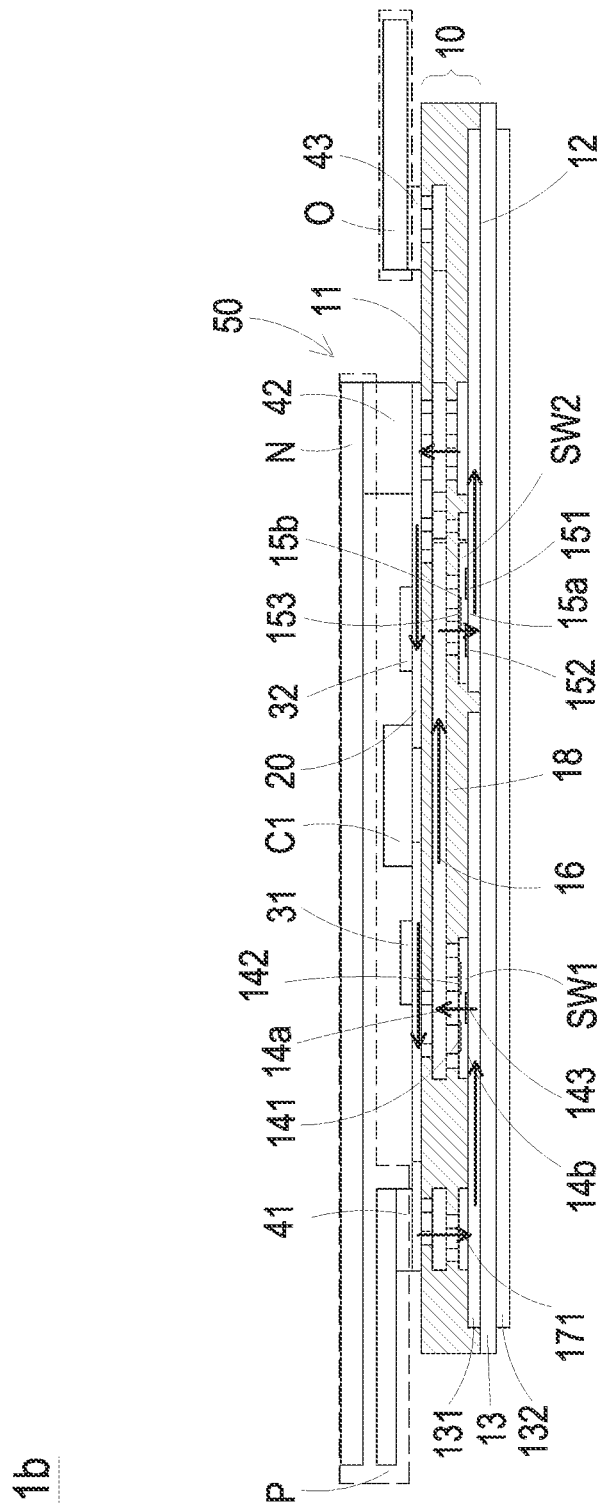
FIG. 11A is a schematic cross-sectional view illustrating the current flow of the first high-frequency loop of the power module assembly according to a third embodiment of the present disclosure.
Figure 11B:
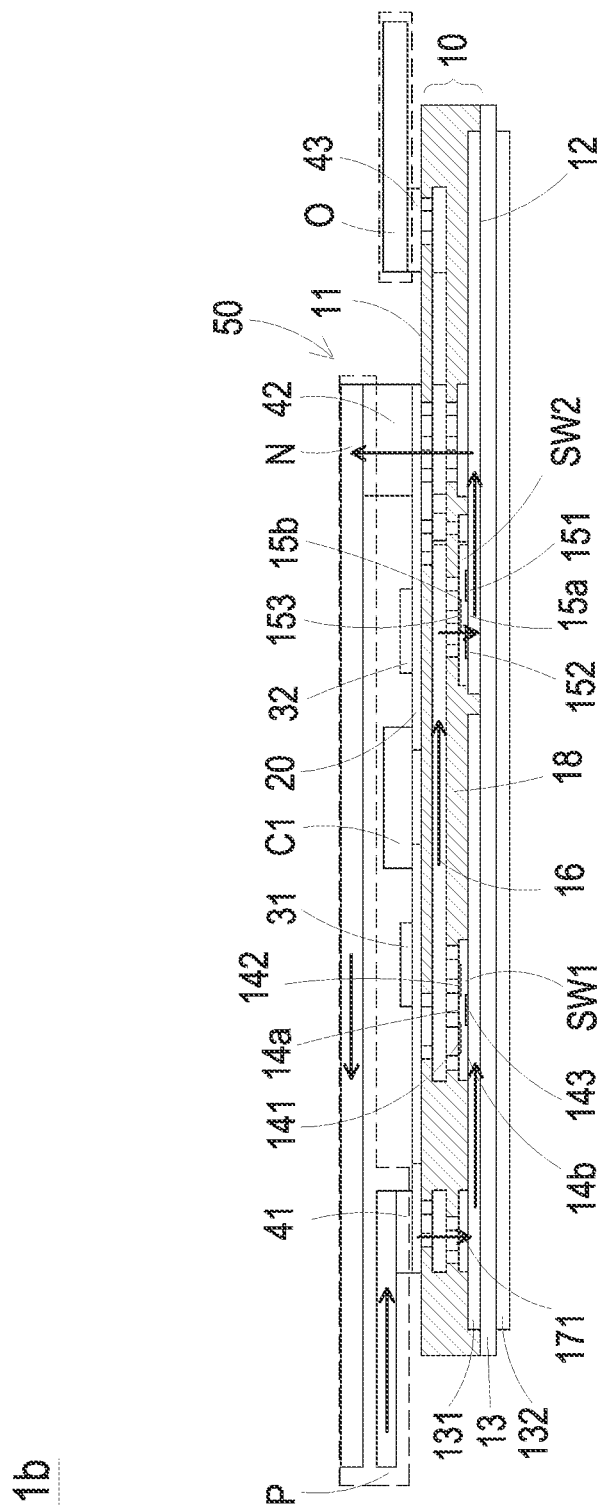
FIG. 11B is a schematic cross-sectional view illustrating the current flow of the second high-frequency loop of the power module assembly according to the third embodiment of the present disclosure.

FIG. 11A is a schematic cross-sectional view illustrating the current flow of the first high-frequency loop of the power module assembly according to a third embodiment of the present disclosure. FIG. 11B is a schematic cross-sectional view illustrating the current flow of the second high-frequency loop of the power module assembly according to the third embodiment of the present disclosure. In the embodiment, the structures, elements and functions of the power module assembly 1b are similar to those of the power module 1 of FIG. 1 and FIGS. 6A and 6B, and are not redundantly described herein. Different from the power module assembly 1 of the first embodiment with the first side 14a of the first switch SW1 and the first side 15a of the second switch SW2 facing to the first surface 11, in the embodiment, the first side 14a of the first switch SW1 faces the first surface 11, but the first side 15a of the second switch SW2 faces the second surface 12. In the embodiment, as shown in FIG. 11A, the flow of the high-frequency current of the first high-frequency loop is indicated by the arrow. It flows from the first wiring layer 20, through the third wiring layer 16, the substrate 13, the first switch SW1, the third wiring layer 16, the second switch SW2, the substrate 13, the third wiring layer 16, and then back to the first wiring layer 20.

In addition, as shown in FIG. 11B, the flow of the high-frequency current of the second high-frequency loop is indicated by the arrow. It flows from the positive-electrode bus P, through the positive-electrode extension part 41, the first wiring layer 20, the third wiring layer 16, the substrate 13, the first switch SW1, the third wiring layer 16, the second switch SW2, the substrate 13, the third wiring layer 16, the first wiring layer 20, the negative-electrode extension part 42 and then flows out of the negative-electrode bus N.

In the embodiment, the positive-electrode bus P and the negative-electrode bus N are parallel to each other. Moreover, the projection of the positive-electrode bus P and the negative-electrode bus N on the first surface 11 of the package body 10 and the projection of the first switch SW1 and the second switch SW2 on the first surface 11 are at least partially overlapped. In that, the area enclosed by the second high-frequency loop is relatively small, and the parasitic inductance L2 in FIG. 2 is small. Consequently, the voltage stress on the first switch SW1 and the second switch SW2 is reduced.

Moreover, in FIG. 11B, the current of the second high-frequency loop does not flow through the first wiring layer 20, so that the current path of the second high-frequency loop and the current path of the first high-frequency loop are at least partially decoupled. Thus, the mutual influence between the first switch SW1 and the second switch SW2 is small.

Figure 12A:
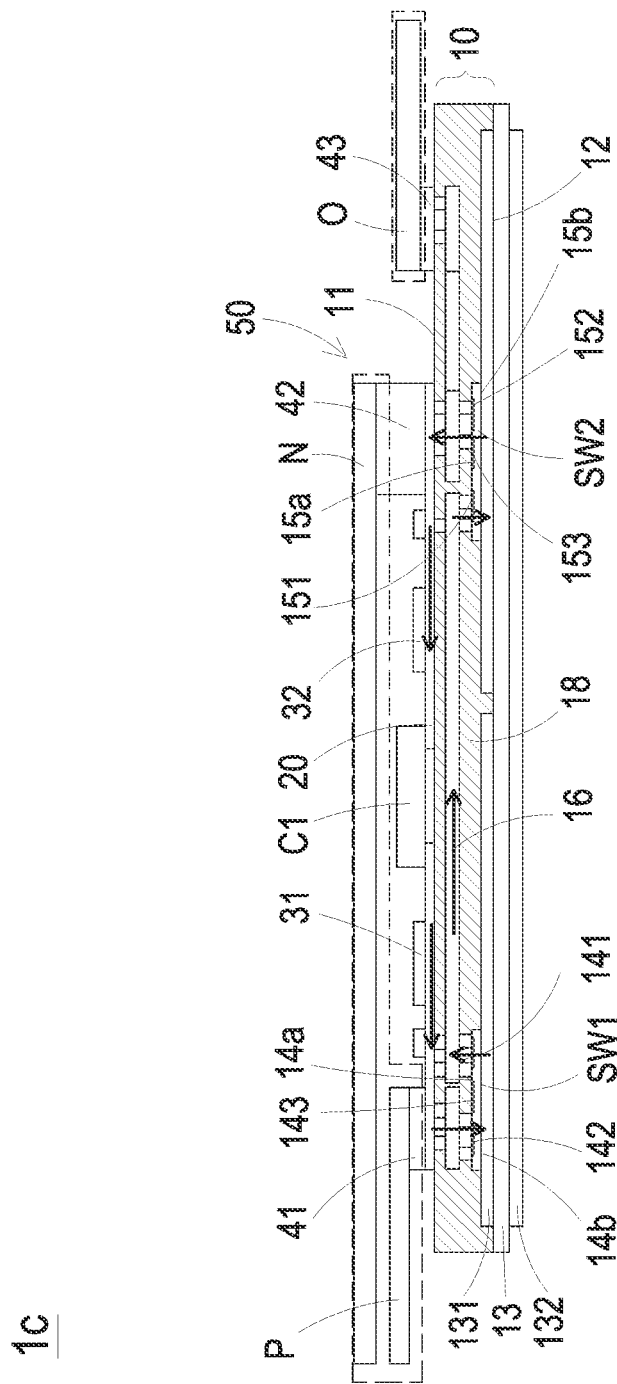
FIG. 12A is a schematic cross-sectional view illustrating the current flow of the first high-frequency loop of the power module assembly according to a fourth embodiment of the present disclosure.
Figure 12B:
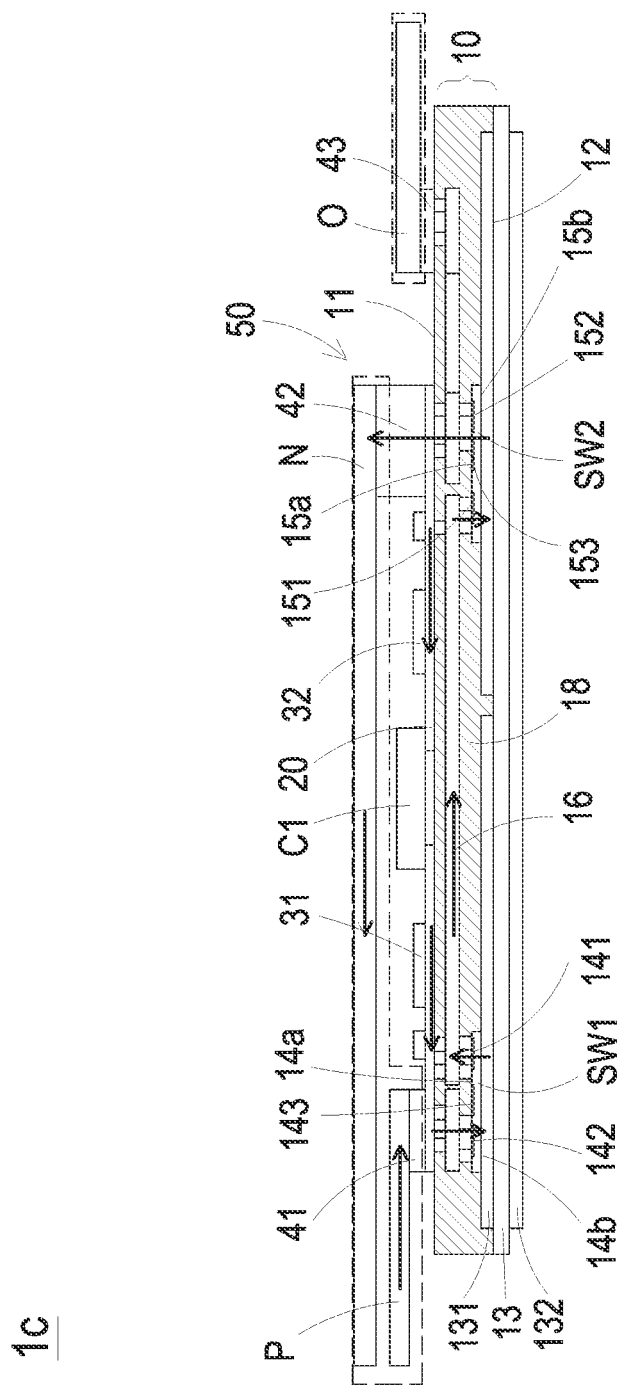
FIG. 12B is a schematic cross-sectional view illustrating the current flow of the second high-frequency loop of the power module assembly according to the fourth embodiment of the present disclosure.

FIG. 12A is a schematic cross-sectional view illustrating the current flow of the first high-frequency loop of the power module assembly according to a fourth embodiment of the present disclosure. FIG. 12B is a schematic cross-sectional view illustrating the current flow of the second high-frequency loop of the power module assembly according to the fourth embodiment of the present disclosure. In the embodiment, the structures, elements and functions of the power module assembly 1c are similar to those of the power module 1 of FIG. 1 and FIGS. 6A and 6B, and are not redundantly described herein. In the embodiment, the first switch SW1 and the second switch SW2 embedded in the package body 10 are planar devices. The first end 141, the second end 142, and the third end 143 of the first switch SW1 are disposed on the first side 14a and face the first surface 11. The first end 151, the second end 152 and the third end 153 of the second switch SW2 are disposed on the first side 15a and face the first surface 11. In the embodiment, the second end 142 of the first switch SW1 is electrically connected to the third end 153 of the second switch SW2 through the third wiring layer 16. By utilizing the combination of the planar first switch SW1, the second switch SW2 and the third wiring layer 16, it is helpful for enhancing the compatibility of the entire power module assembly 1c.

Figure 13A:
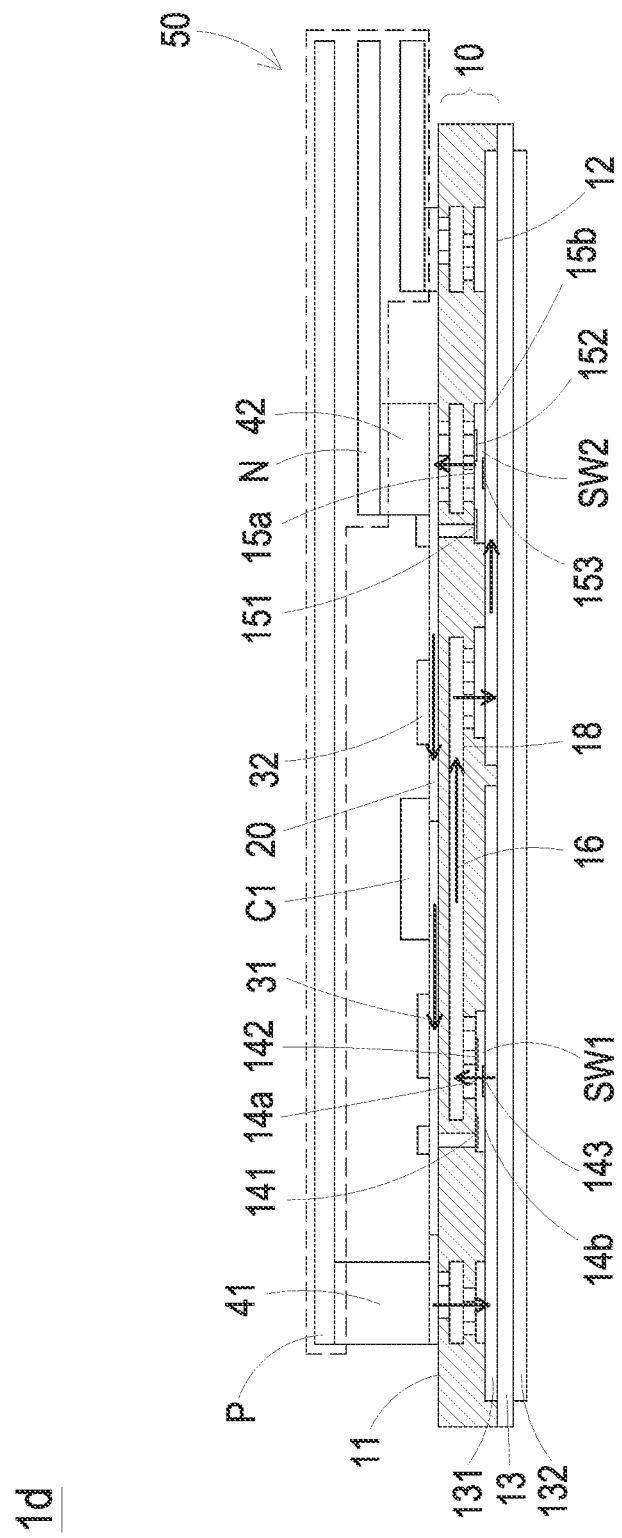
FIG. 13A is a schematic cross-sectional view illustrating the current flow of the first high-frequency loop of the power module assembly according to a fifth embodiment of the present disclosure.
Figure 13B:
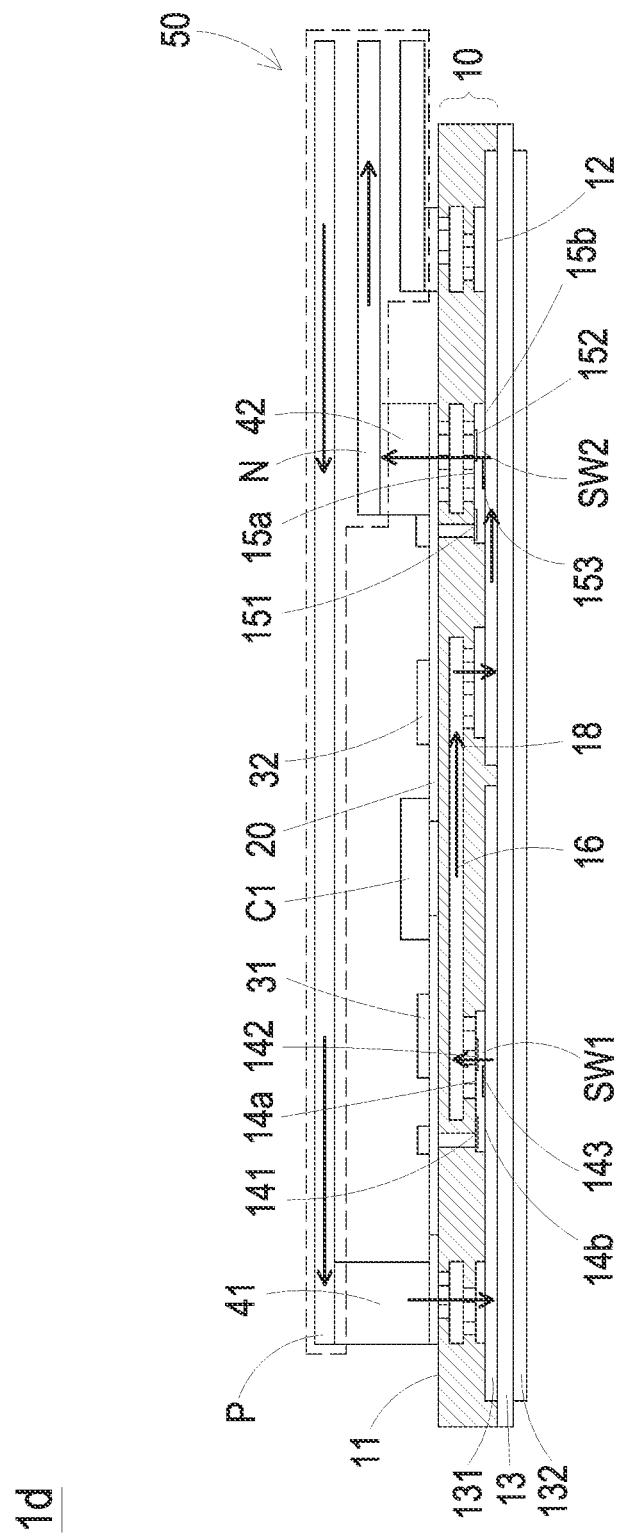
FIG. 13B is a schematic cross-sectional view illustrating the current flow of the second high-frequency loop of the power module assembly according to the fifth embodiment of the present disclosure.

FIG. 13A is a schematic cross-sectional view illustrating the current flow of the first high-frequency loop of the power module assembly according to a fifth embodiment of the present disclosure. FIG. 13B is a schematic cross-sectional view illustrating the current flow of the second high-frequency loop of the power module assembly according to the fifth embodiment of the present disclosure. In the embodiment, the structures, elements and functions of the power module assembly 1d are similar to those of the power module 1 of FIG. 1 and FIGS. 6A and 6B, and are not redundantly described herein. In the embodiment, the positive-electrode bus P, the negative-electrode bus N, and the output bus O of the system bus set 50 are fanned out from the same side of the power module assembly 1d. The output bus O is electrically connected to the midpoint of the bridge arm including the first switch SW1 and the second switch SW2.

Moreover, the output bus O is parallel to the positive-electrode bus P and the negative-electrode bus N, and the projection of the output bus O on the first surface 11 and the projection of the positive-electrode bus P or the negative-electrode bus N on the first surface 11 are at least partially overlapped. In other embodiments, the arrangement of the positive-electrode bus P, the negative-electrode bus N, and the output bus O are adjustable according to the practical requirements, so as to be compatible with different system components. In other embodiments, the positive-electrode extension part 41, the negative-electrode extension part 42 and the output extension part 43 are constructed in a press-fit type to make the connection of the system bus set 50 simpler and more reliable. Certainly, the present disclosure is not limited thereto.

Figure 14:
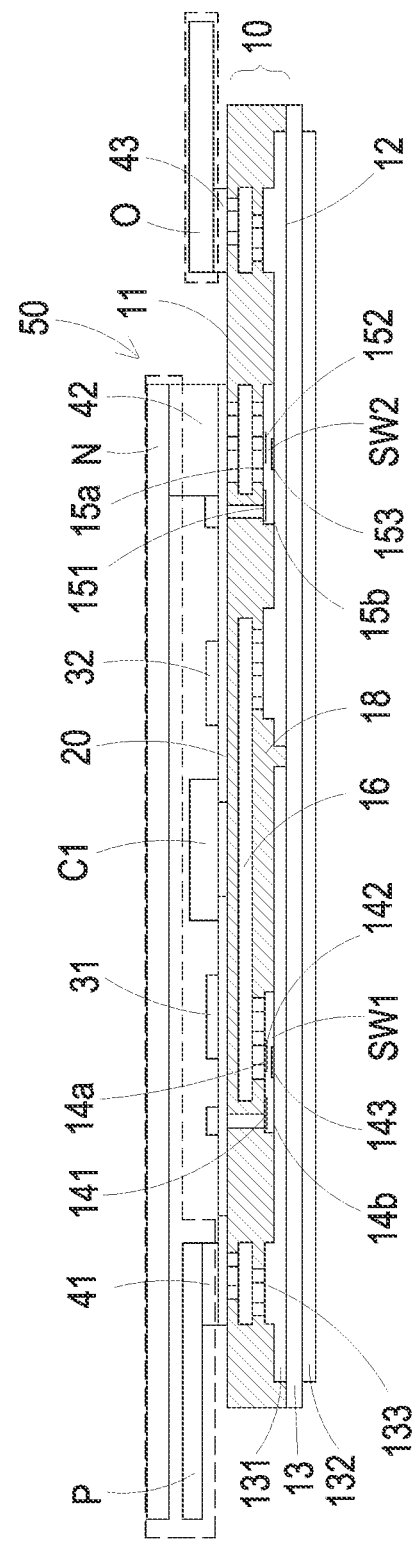
FIG. 14 is a schematic cross-sectional view illustrating the power module assembly according to a sixth embodiment of the present disclosure.

FIG. 14 is a schematic cross-sectional view illustrating the power module assembly according to a sixth embodiment of the present disclosure. In the embodiment, the structures, elements and functions of the power module assembly 1e are similar to those of the power module 1 of FIG. 1 and FIGS. 6A and 6B, and are not redundantly described herein. In the embodiment, the second wiring layer 131 of the substrate 13 further includes a metal bump 133, which is disposed on the second wiring layer 131 of the substrate 13 and is configured to provide a conductive function. Preferably but not exclusively, in the embodiment, the bump 133 is formed by half-etching process after the copper layer is coated on the insulation substrate. It has advantages of omitting the conductive structure 171 (referring to FIG. 1), reducing the number of components, facilitating the control of incoming materials and reducing the welding requirements. Consequently, it makes the process simpler and more reliable, and the feasibility of mass production is enhanced.

Figure 15:
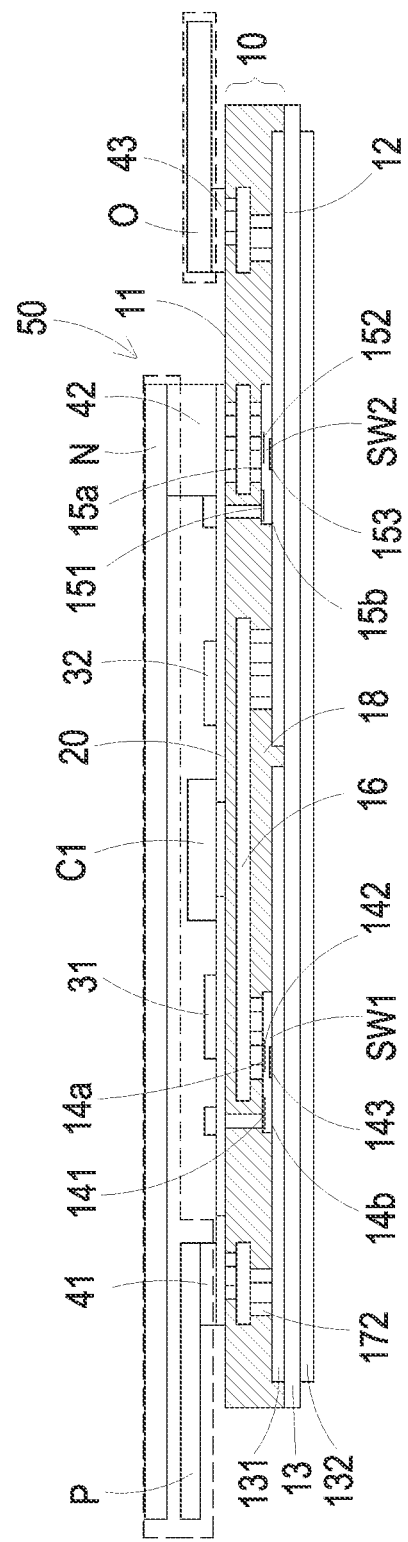
FIG. 15 is a schematic cross-sectional view illustrating the power module assembly according to a seventh embodiment of the present disclosure.

FIG. 15 is a schematic cross-sectional view illustrating the power module assembly according to a seventh embodiment of the present disclosure. In the embodiment, the structures, elements and functions of the power module assembly if are similar to those of the power module 1 of FIG. 1 and FIGS. 6A and 6B, and are not redundantly described herein. In the embodiment, the conduction of the third wiring layer 16 in the package body 10 to the second wiring layer 131 of the substrate 13, the first switch SW1 and the second switch SW2 are directly realized by a plurality of vias 172. The plurality of vias 172 have different depths, so that the conductive structure 171 (referring to FIG. 1) can be omitted. It is helpful for reducing the number of components, facilitating the control of incoming materials and reducing the welding requirements. Consequently, it makes the process simpler and more reliable, and the feasibility of mass production is enhanced.

Figure 16:
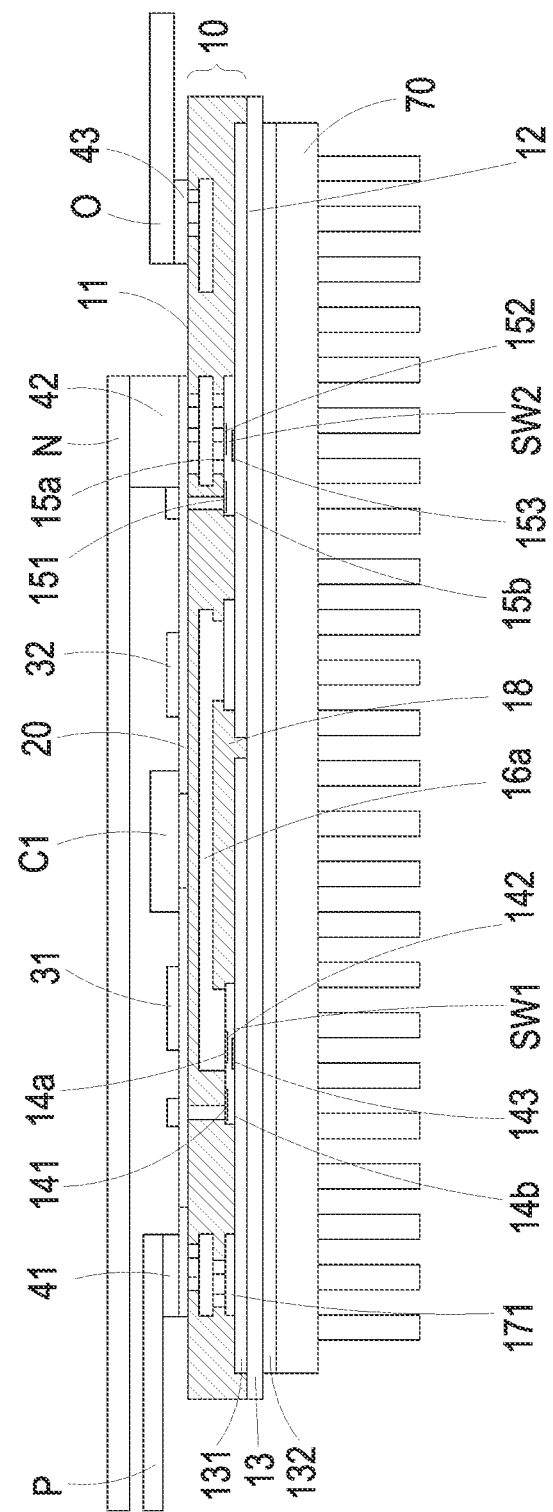
FIG. 16 is a schematic cross-sectional view illustrating the power module assembly according to an eighth embodiment of the present disclosure.

FIG. 16 is a schematic cross-sectional view illustrating the power module assembly according to an eighth embodiment of the present disclosure. In the embodiment, the structures, elements and functions of the power module assembly 1g are similar to those of the power module 1 of FIG. 1 and FIGS. 6A and 6B, and are not redundantly described herein. In the embodiment, the power module assembly 1g includes a first heat dissipation module 70 thermally coupled to the additional wiring layer 132. Preferably but not exclusively, a pin-fin liquid cooling method is utilized in the first heat dissipation module 70 to reduce thermal resistance. In addition, the third wiring layer is replaced by a copper strip 16a, which is embedded in the package body 10 to increase the cross-sectional area of the current path, and reduce the resistance and the loss. At the same time, the copper strip 16a is greatly helpful for reducing the cost of thick copper plating process for forming the substrate 13. Preferably but not exclusively, the copper strip 16a is connected to the first switch SW1 and the second switch SW2 by welding. The process is simple to realize and the reliability is great.

Figure 17:
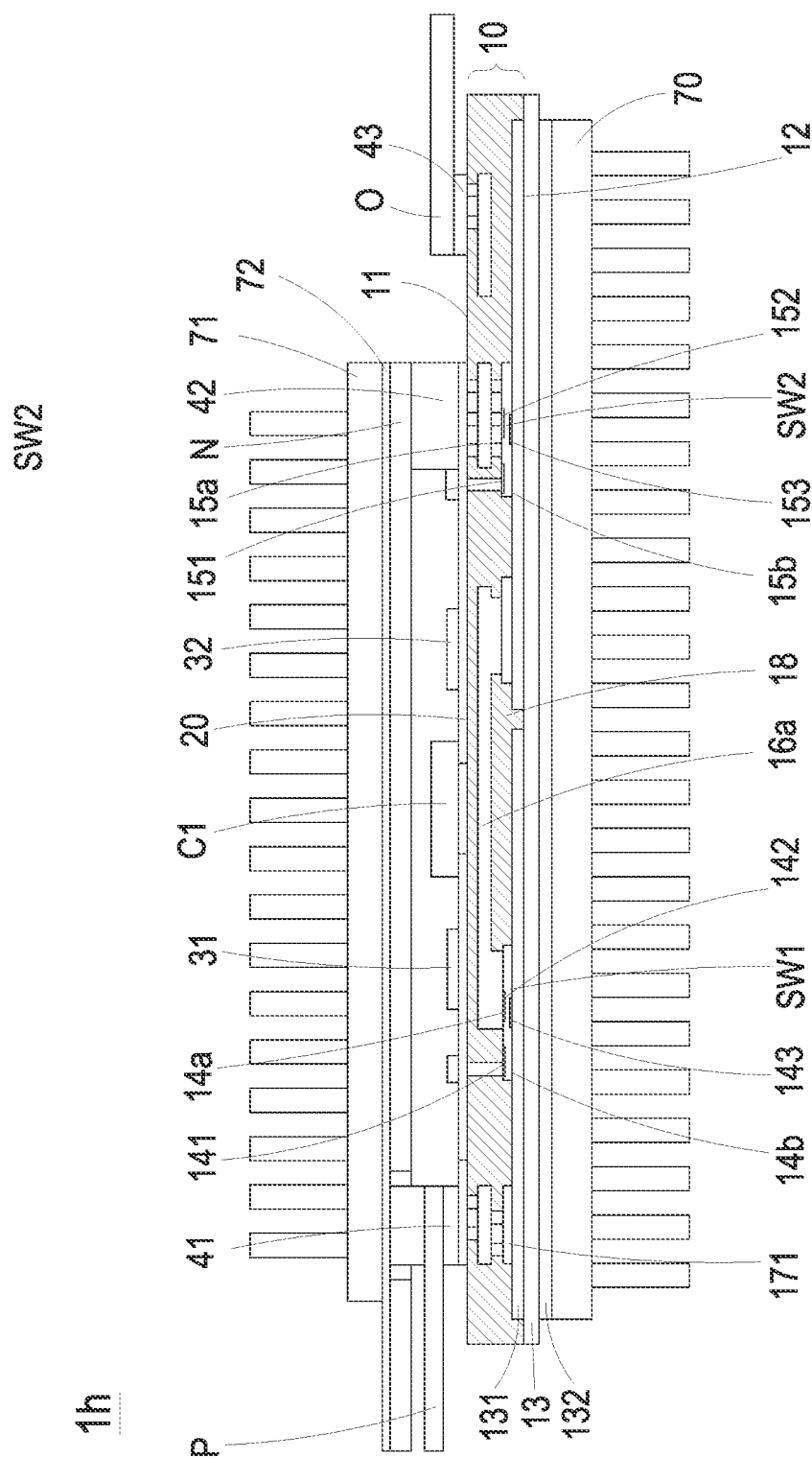
FIG. 17 is a schematic cross-sectional view illustrating the power module assembly according to a ninth embodiment of the present disclosure.

FIG. 17 is a schematic cross-sectional view illustrating the power module assembly according to a ninth embodiment of the present disclosure. In the embodiment, the structures, elements and functions of the power module assembly 1h are similar to those of the power module 1g of FIG. 16, and are not redundantly described herein. In the embodiment, the power module assembly 1h further includes a second heat dissipation module 71 and a thermal-conductive insulating layer 72. The second heat dissipation module 71 is thermally coupled to the negative-electrode bus N of the system bus set 50 through the thermal-conductive insulating layer 72. Therefore, another heat dissipation path is added, a double-sided heat dissipation is achieved, and the thermal resistance is further reduced. Preferably but not exclusive, in the embodiment, the thermal-conductive insulating layer 72 is a thermal-conductive insulating film made of organic materials, or a thermal-conductive insulating layer made of ceramic materials. In other embodiments, the thermal-conductive insulating layer 72 is a multilayer structure or composed of multiple complex materials. The present disclosure is not limited thereto.

Figure 18A:
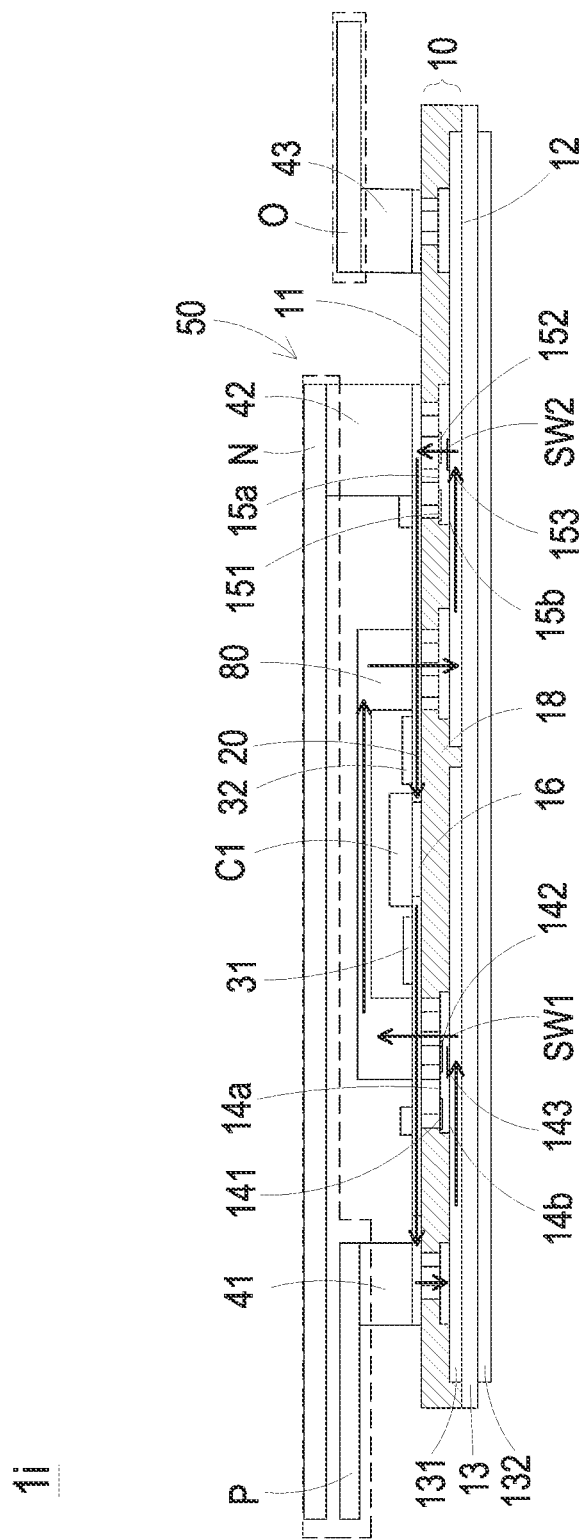
FIG. 18A is a schematic cross-sectional view illustrating the current flow of the first high-frequency loop of the power module assembly according to a tenth embodiment of the present disclosure.
Figure 18B:
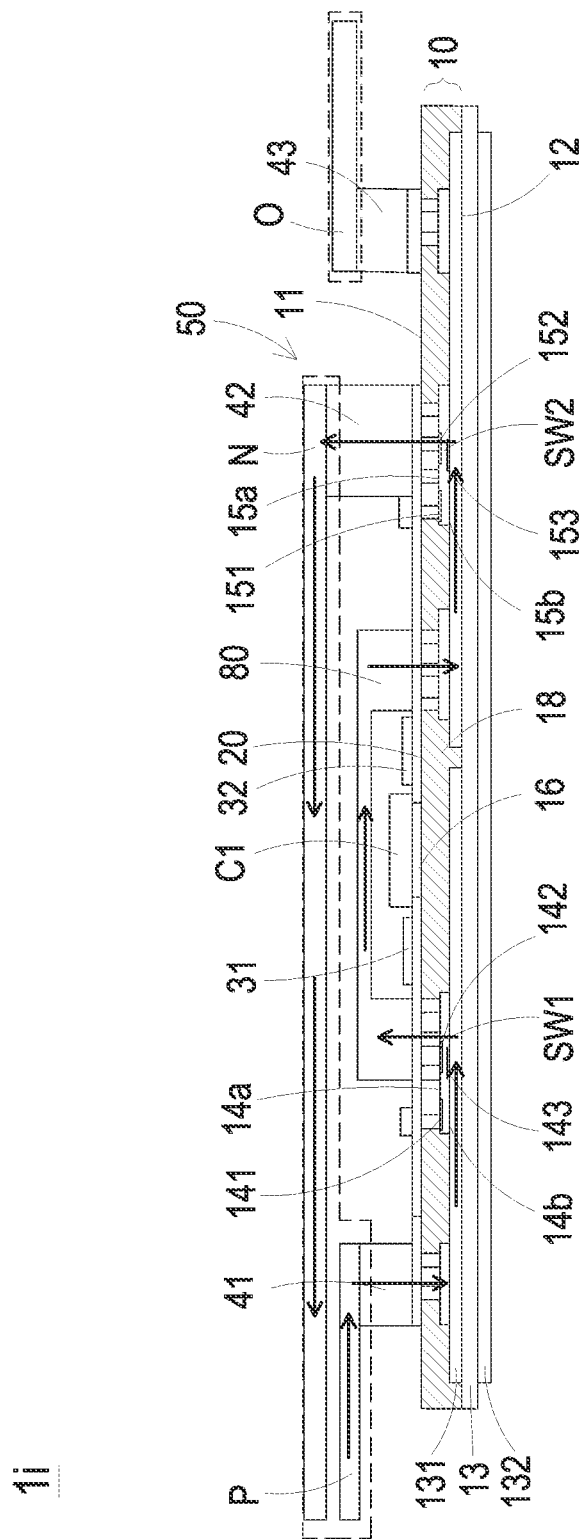
FIG. 18B is a schematic cross-sectional view illustrating the current flow of the second high-frequency loop of the power module assembly according to the tenth embodiment of the present disclosure.

FIG. 18A is a schematic cross-sectional view illustrating the current flow of the first high-frequency loop of the power module assembly according to a tenth embodiment of the present disclosure. FIG. 18B is a schematic cross-sectional view illustrating the current flow of the second high-frequency loop of the power module assembly according to the tenth embodiment of the present disclosure. In the embodiment, the structures, elements and functions of the power module assembly 1i are similar to those of the power module 1 of FIG. 1 and FIGS. 6A and 6B, and are not redundantly described herein. In the embodiment, the power module assembly 1i includes a metal conductive strip 80 disposed on the first surface 11 of the package body 10 for electrically connecting the first switch SW1 and the second switch SW2. In the embodiment, the metal conductive strip 80 is disposed between the negative-electrode bus N and the first wiring layer 20, and the metal conductive strip 80 is also located above the capacitor C1 and crosses the capacitor C1 and the two driving components 31 and 32. Preferably but not exclusively, in the embodiment, the first wiring layer 20 includes two isolation-island regions (not shown), and the metal conductive strip 80 is connected to the two isolation-island regions of the first wiring layer 20 by welding. Consequently, the second end 142 of the first switch SW1 and the third terminal 153 of the second switch SW2 are electrically connected. Thus, in the second high-frequency loop shown in FIG. 18B, the current directions of the negative-electrode bus N and the metal conductive strip 80 are opposite to each other, and the area of the second high-frequency loop is smaller. It is helpful for reducing the parasitic inductance (corresponding to the inductance L2 in FIG. 2) in the second high-frequency loop. Consequently, the voltage stress of the first switch SW1 and the second switch SW2 is reduced. Furthermore, the metal conductive strip 80 is connected to the first wiring layer 20 by welding, which is simpler, more reliable, and less costly than the solution of forming a thick copper inside the insulation-material layer 18. The corresponding high-frequency current flow of the first high-frequency loop is shown in FIG. 18A.

Figure 19A:
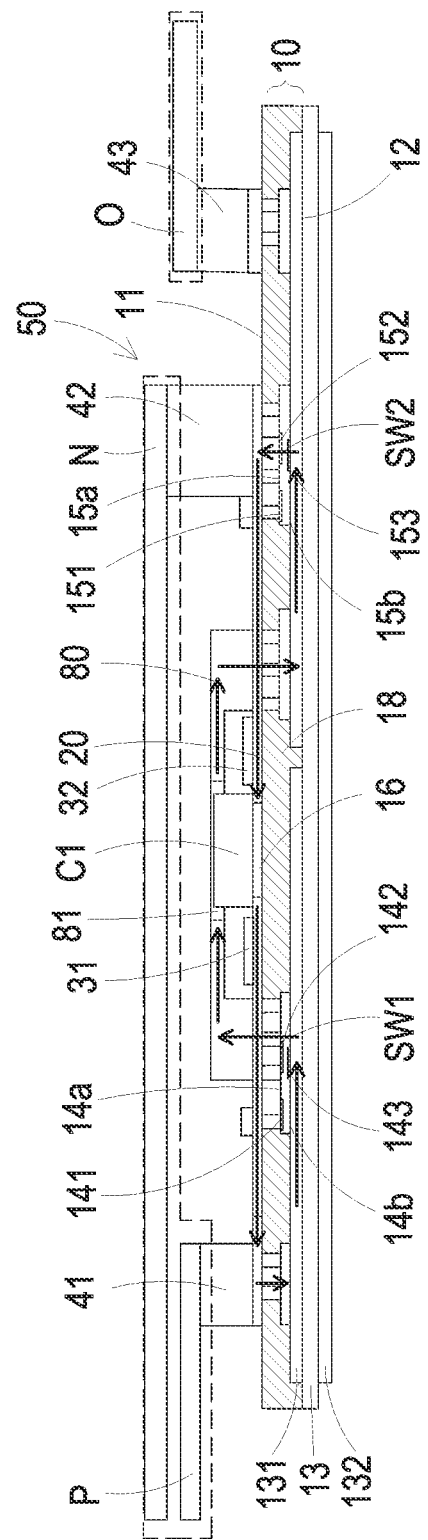
FIG. 19A is a schematic cross-sectional view illustrating the current flow of the first high-frequency loop of the power module assembly according to an eleventh embodiment of the present disclosure.
Figure 19B:
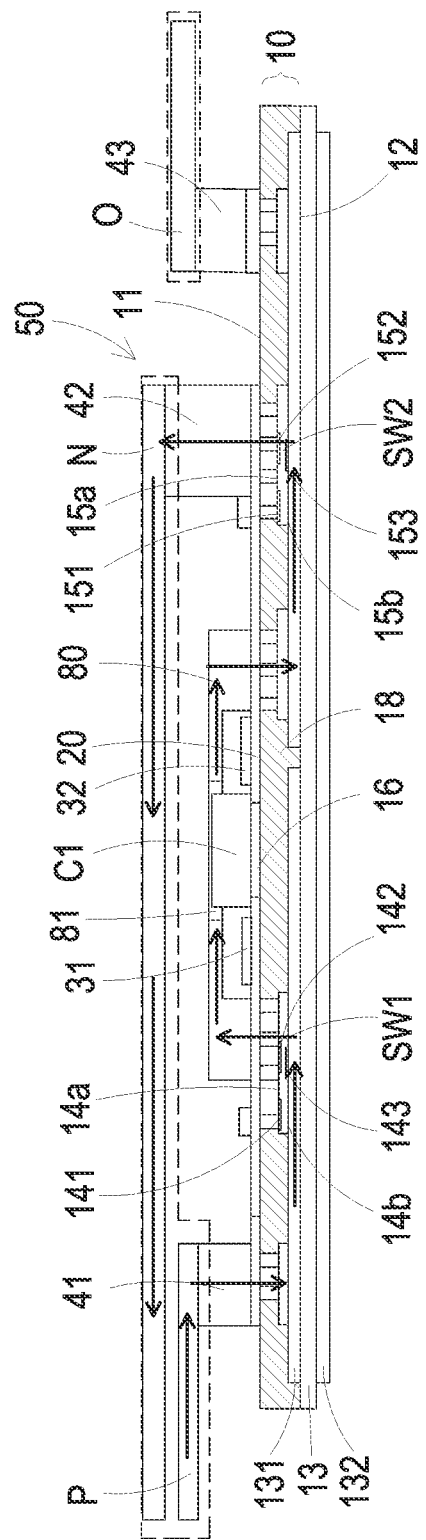
FIG. 19B is a schematic cross-sectional view illustrating the current flow of the second high-frequency loop of the power module assembly according to the eleventh embodiment of the present disclosure.

FIG. 19A is a schematic cross-sectional view illustrating the current flow of the first high-frequency loop of the power module assembly according to an eleventh embodiment of the present disclosure. FIG. 19B is a schematic cross-sectional view illustrating the current flow of the second high-frequency loop of the power module assembly according to the eleventh embodiment of the present disclosure. In the embodiment, the structures, elements and functions of the power module assembly 1j are similar to those of the power module 1i of FIGS. 18A and 18B, and are not redundantly described herein. In the embodiment, the metal conductive strip 80 further includes a slot 81, and the capacitor C1 is accommodated in the slot 81 to reduce the height of the power module assembly 1j and improve the power density. Furthermore, as the height of the metal conductive strip 80 is decreased, the current-path length of the second high-frequency loop is decreased. Thus, the stray inductance is reduced.

Figure 20A:
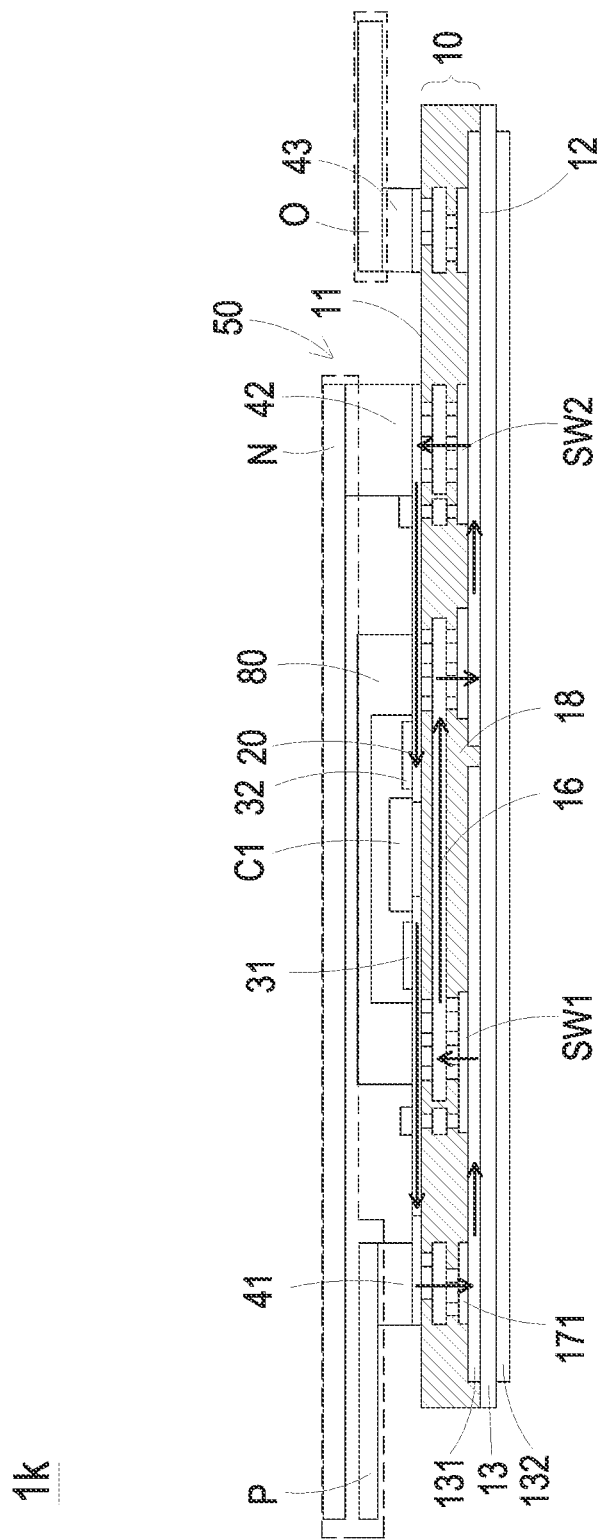
FIG. 20A is a schematic cross-sectional view illustrating the current flow of the first high-frequency loop of the power module assembly according to a twelfth embodiment of the present disclosure.
Figure 20B:
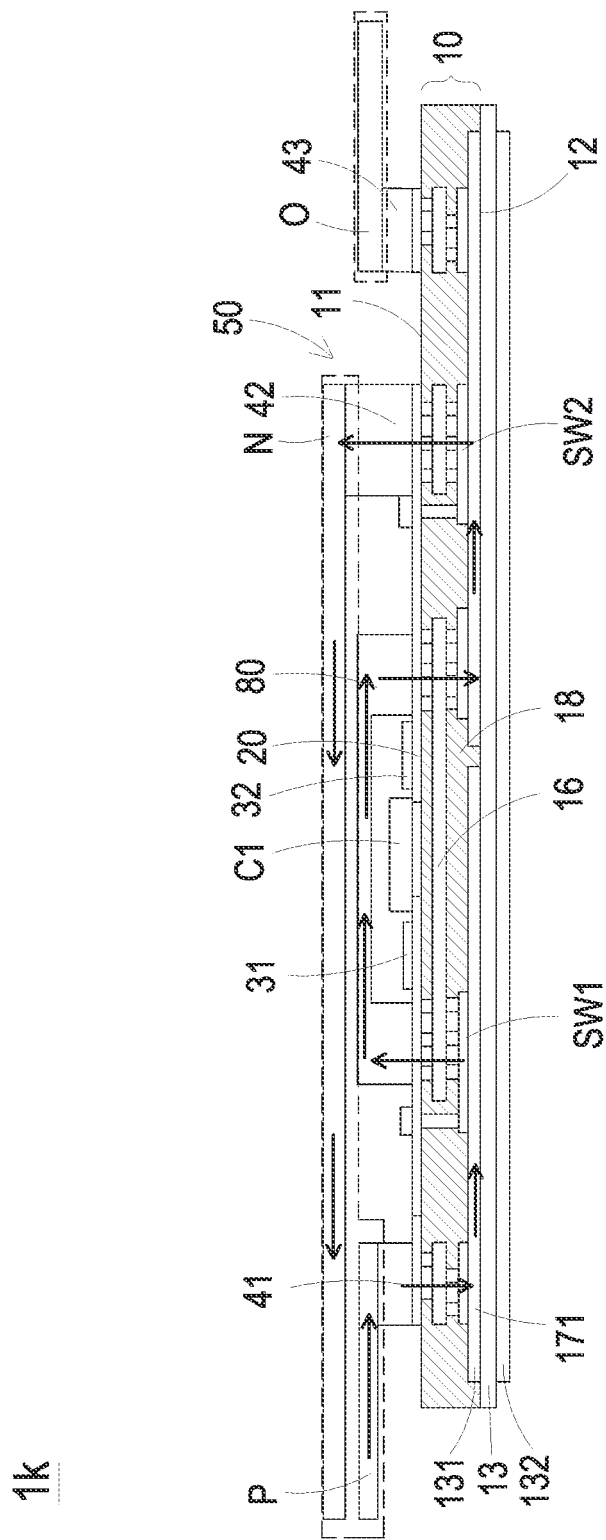
FIG. 20B is a schematic cross-sectional view illustrating the current flow of the second high-frequency loop of the power module assembly according to the twelfth embodiment of the present disclosure.

FIG. 20A is a schematic cross-sectional view illustrating the current flow of the first high-frequency loop of the power module assembly according to a twelfth embodiment of the present disclosure. FIG. 20B is a schematic cross-sectional view illustrating the current flow of the second high-frequency loop of the power module assembly according to the twelfth embodiment of the present disclosure. In the embodiment, the structures, elements and functions of the power module assembly 1k are similar to those of the power module 1 of FIG. 1 and FIGS. 6A and 6B, and are not redundantly described herein. In the embodiment, as shown in FIG. 20B, the current flow of the second high-frequency loop of the power module assembly 1k flows through the metal conductive strip 80. Notably, since the height of the capacitor C1 is larger and the path of entire loop is longer, it results in a larger stray inductance. Therefore, in some embodiments, an additional wiring layer, such as the third wiring layer 16 in FIG. 1, is embedded in the package body 10, so as to form the loop with the capacitor C1, and the path of entire loop is short. Preferably but not exclusively, the insulation-material layer 18 between the wiring layers can be very thin, and the two wiring layers with opposite current directions are very close. It is beneficial for achieving an electromagnetic field cancellation, and reducing the stray inductance effectively. Certainly, the present disclosure is not limited thereto.

Figure 21:
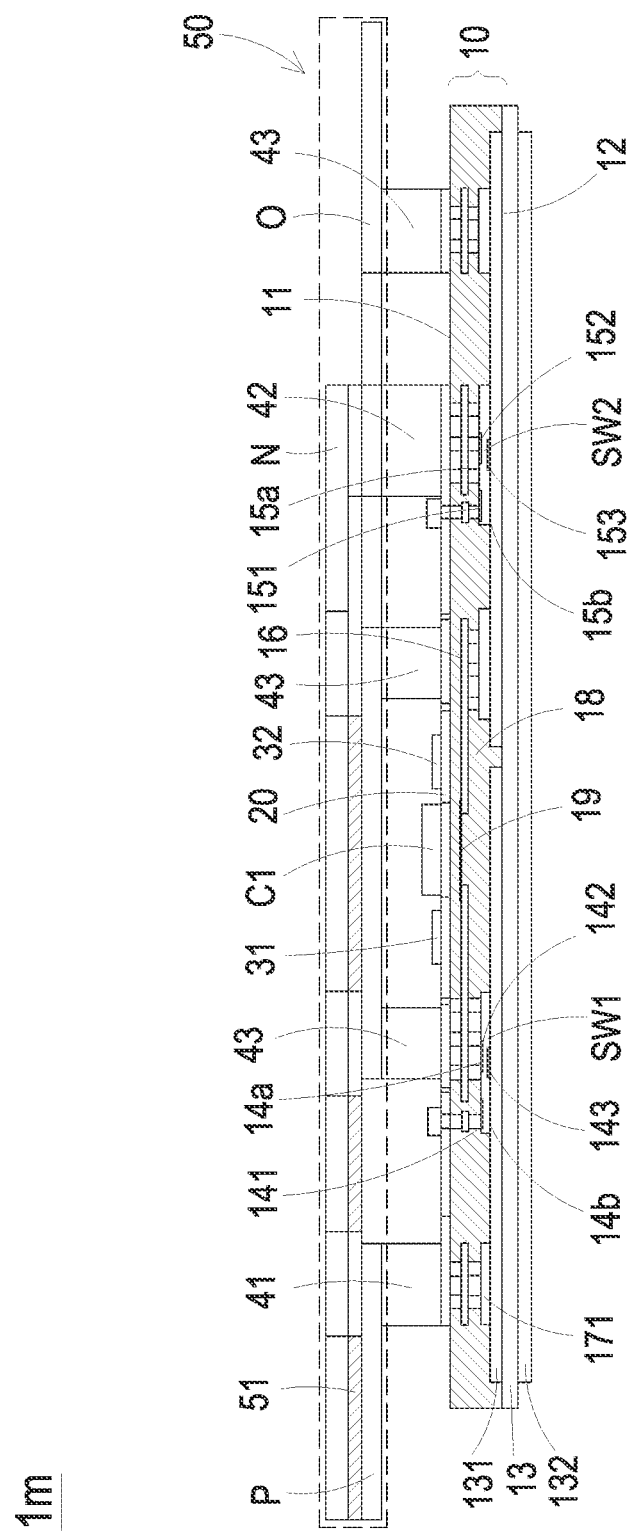
FIG. 21 is a schematic cross-sectional view illustrating the power module assembly according to a thirteenth embodiment of the present disclosure.

FIG. 21 is a schematic cross-sectional view illustrating the power module assembly according to a thirteenth embodiment of the present disclosure. In the embodiment, the structures, elements and functions of the power module assembly 1m are similar to those of the power module 1h of FIG. 17, and are not redundantly described herein. In the embodiment, the positive-electrode bus P, the negative-electrode bus N and the output bus O of the system bus set 50 are integrated as a whole. The positive-electrode bus P, the negative-electrode bus N, and the output bus O are directly welded to the surfaces of the positive-electrode extension part 41, the negative-electrode extension part 42 and the output extension part 43, respectively, by laser welding. Furthermore, flexible insulators 51 are filled between the positive-electrode bus P and the negative-electrode bus N, and between the negative-electrode bus N and the output bus O. The function of the flexible insulator 51 is to compensate the dimensional tolerances between the positive-electrode bus P and the output bus O, and between the negative-electrode bus N and the output bus O, which are caused by the height differences of the positive-electrode extension part 41, the negative-electrode extension part 42 and the output extension part 43 during the welding process, so as to ensure a better welding effect. Moreover, in the embodiment, the package body 10 further includes a thick-film or thin-film resistor 19, which is disposed on the third wiring layer 16, and the resistor 19 is used to distribute the current in the first high-frequency loop and the second high-frequency loop directly, so as to partially decouple the first high-frequency loop and the second high-frequency loop. Preferably but not exclusively, the current of the first high-frequency loop mainly flows through the third wiring layer 16, while the current of the second high-frequency loop mainly flows through the output bus O. It makes the current paths of the first high-frequency loop and the second high-frequency loops smoother. Moreover, the interference of the first high-frequency loop and the second high-frequency loop is eliminated, and the impedance is reduced. Consequently, the loss on the current path is reduced.

Figure 22:
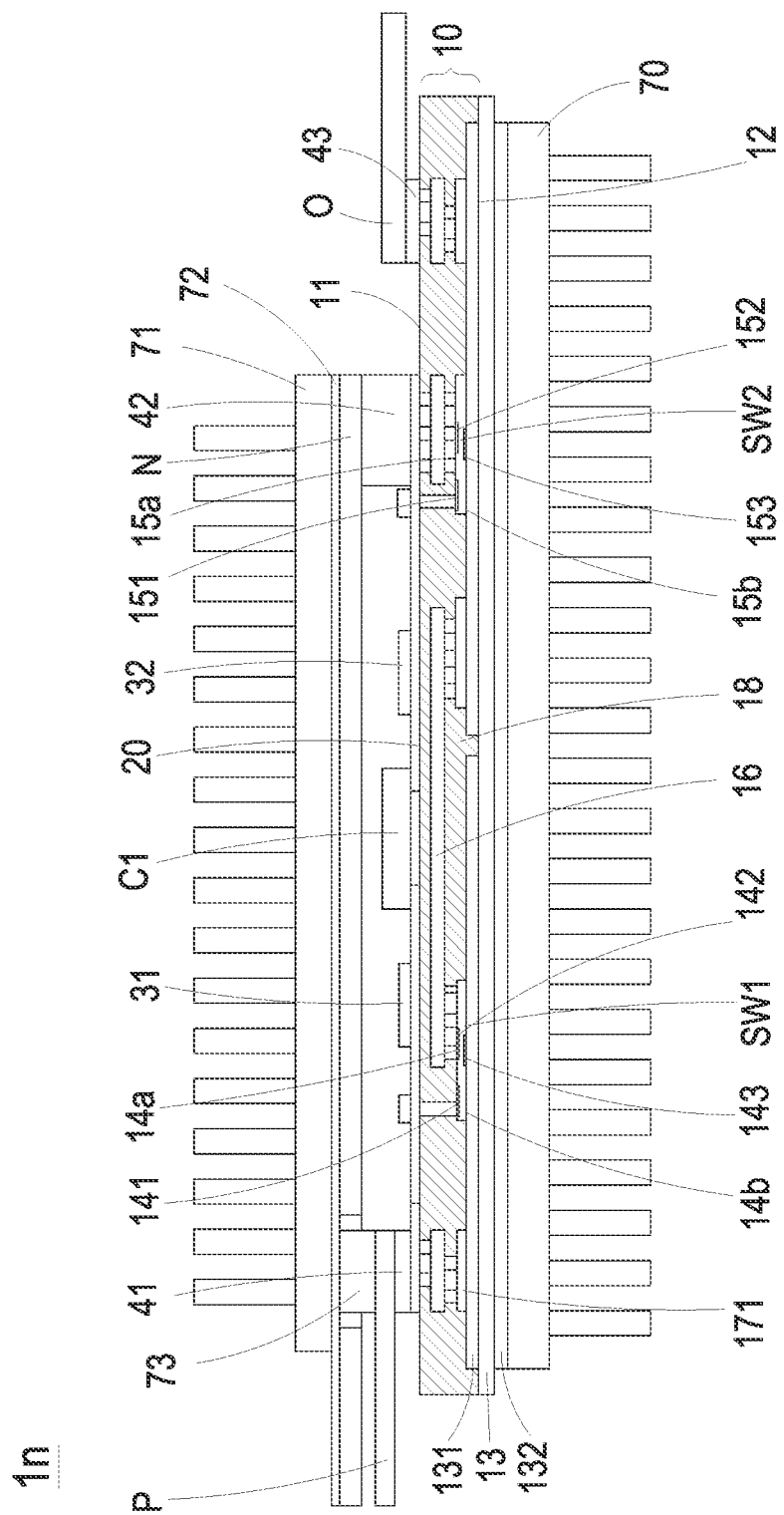
FIG. 22 is a schematic cross-sectional view illustrating the power module assembly according to a fourteenth embodiment of the present disclosure.

FIG. 22 is a schematic cross-sectional view illustrating the power module assembly according to a fourteenth embodiment of the present disclosure. In the embodiment, the structures, elements and functions of the power module assembly 1n are similar to those of the power module 1h of FIG. 17, and are not redundantly described herein. In the embodiment, the power module assembly 1n includes a first heat dissipation module 70, a second heat dissipation module 71 and a thermal-conductive insulating layer 72. The first heat dissipation module 70 is thermally coupled to the second surface 12 of the package body 10. The second heat dissipation module 71 is thermally coupled to the system bus set 50 through the thermal-conductive insulating layer 72. Preferably but not exclusively, the positive-electrode bus P is thermally coupled with the second heat dissipation module 71 through the thermal-conductive insulating layer 72 and the metal block 73. Thus, a double-side heat dissipation is achieved in the power module assembly 1n and the thermal resistance is reduced. Preferably but not exclusively, in the embodiment, the thermal-conductive insulating layer 72 is a thermal-conductive insulating film made of organic materials, or a thermal-conductive insulating layer made of ceramic materials. In other embodiments, the thermal-conductive insulating layer 72 may have a multi-layer structure or be composed of multiple complex materials. The present disclosure is not limited thereto. In the embodiment, the first switch SW1 and the second switch SW2 are the vertical power devices. As the first side 14a of the first switch SW1 embedded in the package body 10 faces the first surface 11, the heat from the third end 143 is dissipated through the substrate 13, and the heat from the second end 142 is dissipated through the third wiring layer 16 to the circuit board 13. As the first side 15a of the second switch SW2 embedded in the package body 10 faces the first surface 11, the heat from the third end 153 is dissipated through the substrate 13 and the first heat dissipation module 70, and the heat from the second end 152 is dissipated through the negative-electrode extension part 42 and the second heat dissipation module 71. It is beneficial for increasing the heat dissipation paths, realizing the double-side heat dissipation, and reducing the thermal resistance. In other embodiments, as the first switch SW1 and the second switch SW2 are planar power devices, the heat from the electrode surfaces of the first switch SW1 and the second switch SW2 are dissipated through the third wiring layer 16 and the second heat dissipation module 71. Moreover, the rear surfaces of the first switch SW1 and the second switch SW2 are dissipated through the substrate 13 and the first heat dissipation module 70.

Figure 23:
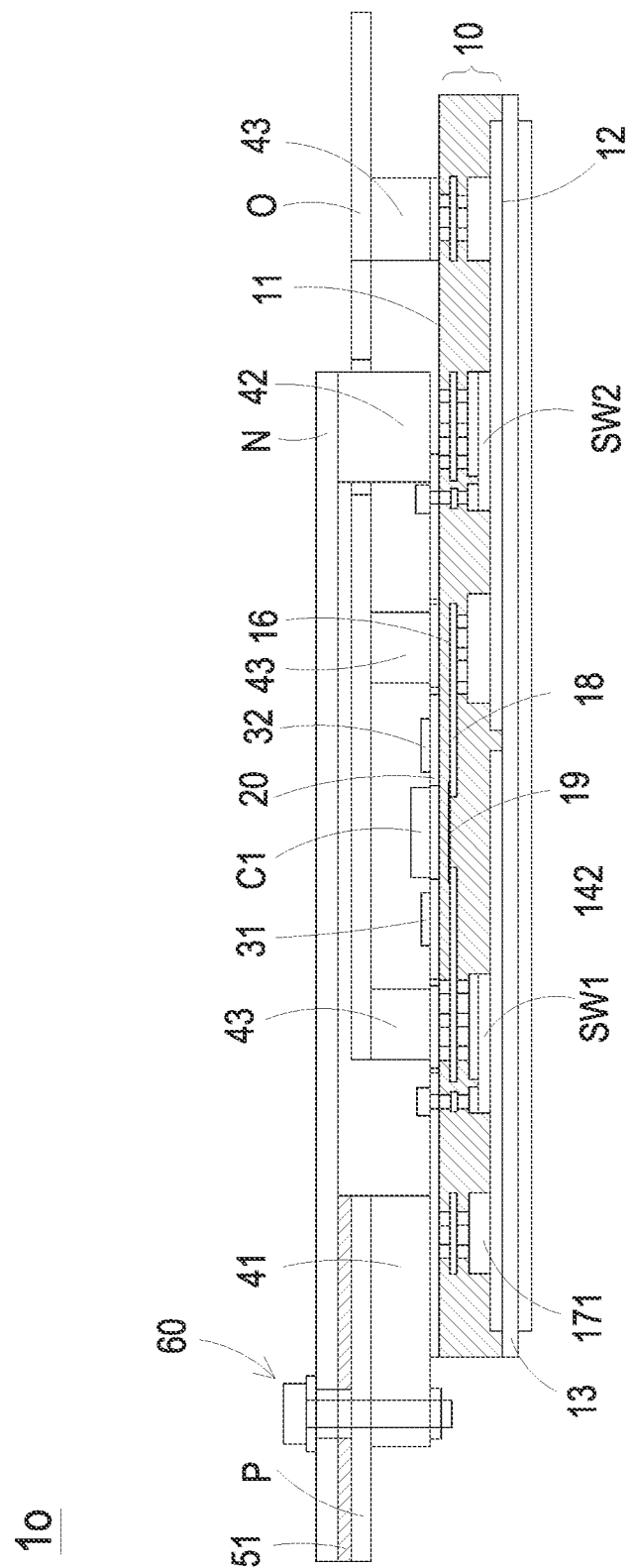
FIG. 23 is a schematic cross-sectional view illustrating the power module assembly according to a fifteenth embodiment of the present disclosure.

FIG. 23 is a schematic cross-sectional view illustrating the power module assembly according to a fifteenth embodiment of the present disclosure. In the embodiment, the structures, elements and functions of the power module assembly 1o are similar to those of the power module 1m of FIG. 21, and are not redundantly described herein. Preferably but not exclusively, in the embodiment, the output bus O is connected to the output extension part 43 by leaser welding. In addition, the positive-electrode bus P is connected to the positive-electrode extension part 41 by a bolt 60. The negative-electrode bus N is connected to the negative-electrode extension part 42 by laser welding. Since the structural integrity of the negative-electrode bus N is maintained above the power module assembly 1o, it facilitates other driving/controlling components to be disposed thereon. On the other hand, with the structural integrity of the negative-electrode bus N, a better shielding effect is achieved between the system end and the output bus O, and it is beneficial for avoiding the electromagnetic interference.

Figure 24:
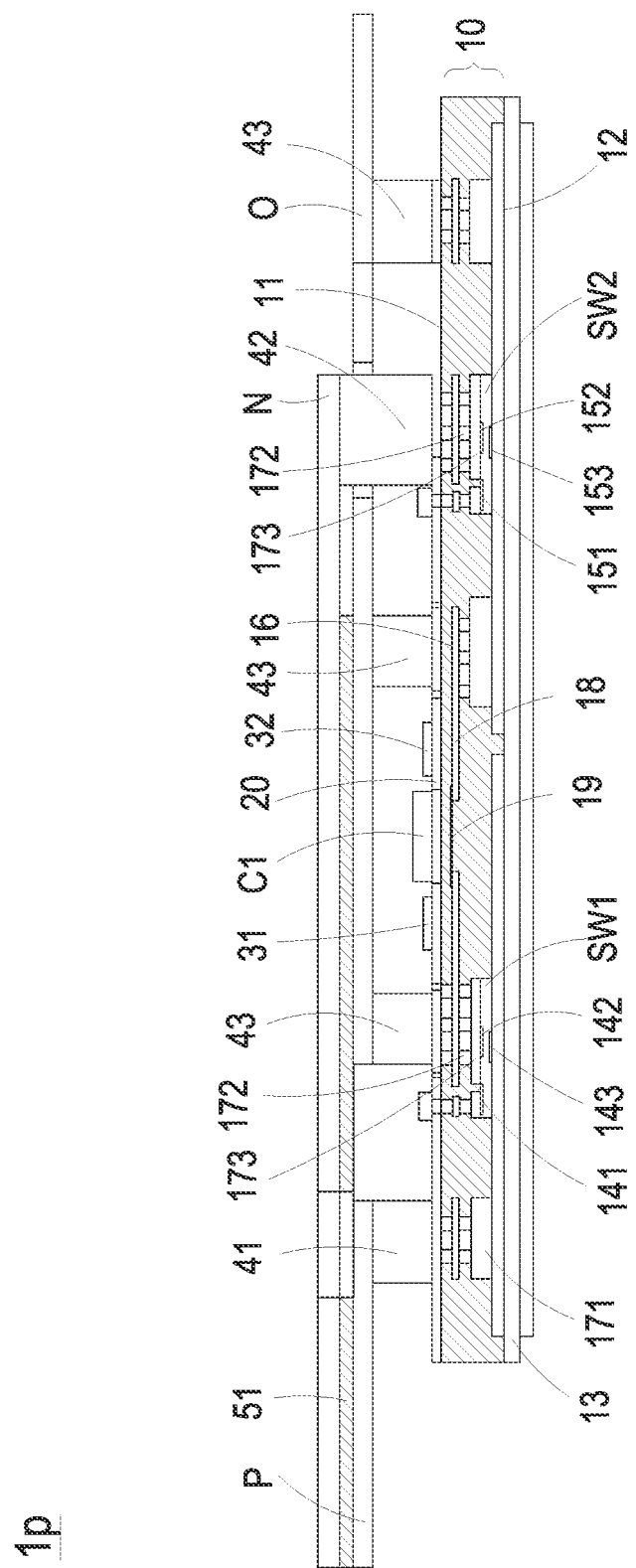
FIG. 24 is a schematic cross-sectional view illustrating the power module assembly according to a sixteenth embodiment of the present disclosure.

FIG. 24 is a schematic cross-sectional view illustrating the power module assembly according to a sixteenth embodiment of the present disclosure. In the embodiment, the structures, elements and functions of the power module assembly 1p are similar to those of the power module 1m of FIG. 21, and are not redundantly described herein. In the embodiment, each of the first end 141 and the second end 142 of the first switch SW1 and the first end 151 and the second end 152 of the second switch SW2 includes a convergence metal block 173 disposed thereon, respectively. In that, the currents flowing through the first end 141, the second end 142, the first end 151 and the second end 152 are converged by the convergence metal block 173 and then flow to the system end through the vias 172. It ensures that the currents flow evenly through the vias 172 to improve the reliability of the product. From a producing point of view, after the welding of the convergence metal block 173 is completed, a polishing process is utilized to ensure the height of the same layers is consistent. It is advantageous for reducing the inconsistency of the height of the vias due to the thickness tolerance of the first switch SW1 and the second switch SW2. It makes the process simpler and more reliable. Furthermore, preferably but not exclusively, the convergence metal block 173 is made of copper. Since the volumetric heat capacity of copper is relatively large, compared with the vias 172, each convergence metal block 173 disposed on the surface of the first switch SW1 and the second switch SW2 is helpful for improving the ability of the first switch SW1 and the second switch SW2 to withstand the large instantaneous current.

Figure 25:
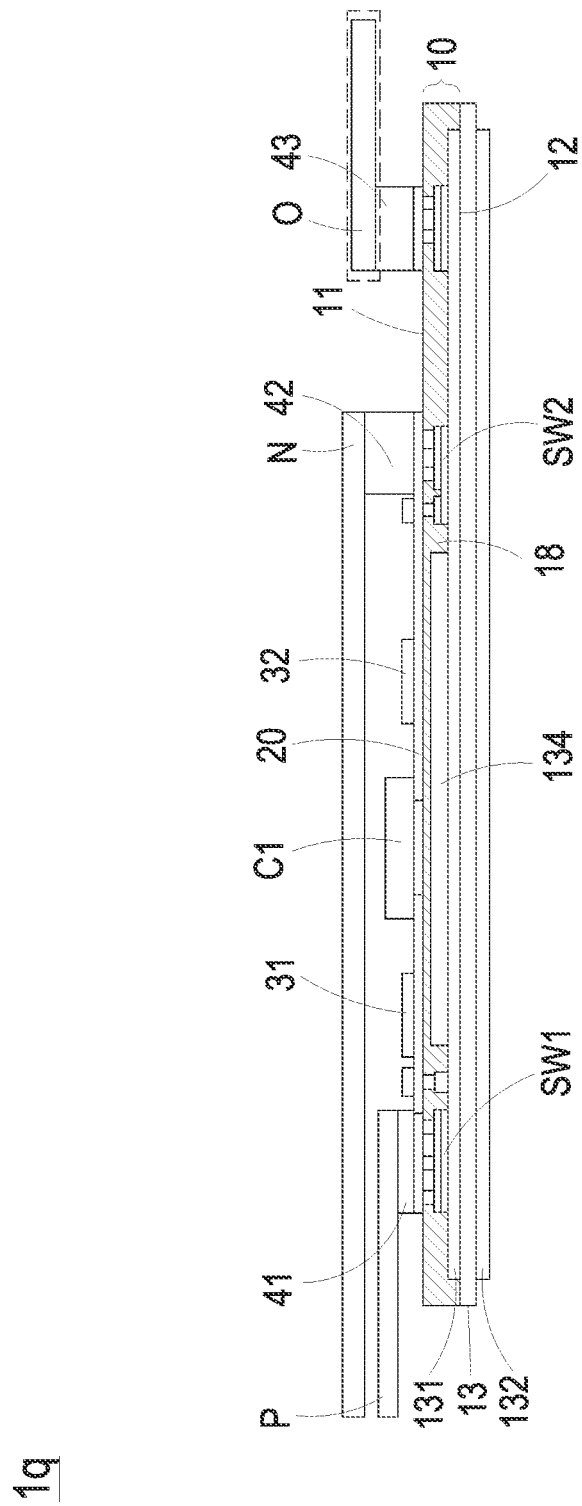
FIG. 25 is a schematic cross-sectional view illustrating the power module assembly according to a seventeenth embodiment of the present disclosure.

FIG. 25 is a schematic cross-sectional view illustrating the power module assembly according to a seventeenth embodiment of the present disclosure. In the embodiment, the structures, elements and functions of the power module assembly 1q are similar to those of the power module 1a of FIGS. 7A and 7B, and are not redundantly described herein. In the embodiment, the package body 10 further includes a conductive metal block 134 disposed on the second wiring layer 131 of the substrate 13. Preferably but not exclusively, the conductive metal block 134 is a thick copper block or a conductive copper strip. The conductive metal block 134 is beneficial for increasing the cross-sectional area of copper in the circuit. Thus, the resistance is reduced to reduce the loss.

Figure 26:
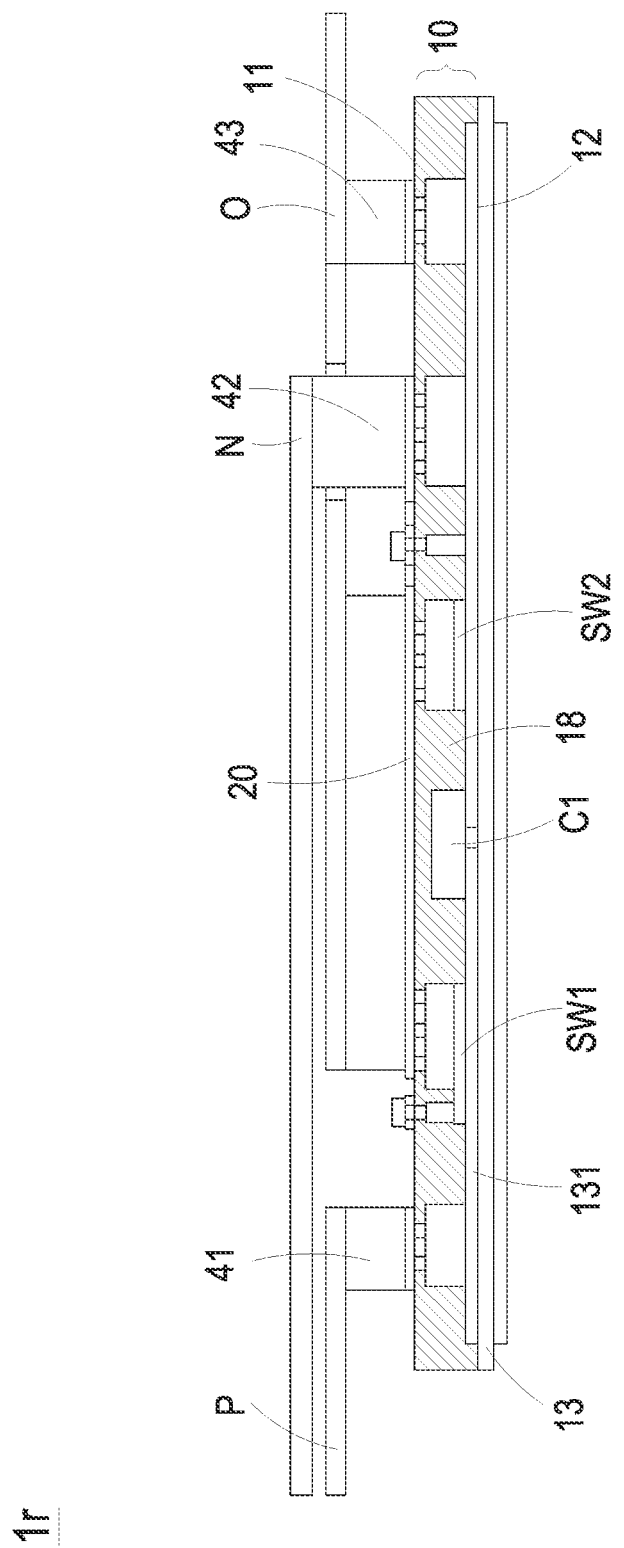
FIG. 26 is a schematic cross-sectional view illustrating the power module assembly according to an eighteenth embodiment of the present disclosure.

FIG. 26 is a schematic cross-sectional view illustrating the power module assembly according to an eighteenth embodiment of the present disclosure. In the embodiment, the structures, elements and functions of the power module assembly 1r are similar to those of the power module 1 of FIG. 1 and FIGS. 6A and 6B, and are not redundantly described herein. In the embodiment, the capacitor C1 is disposed on the second wiring layer 131 of the substrate 13 directly. With the capacitor C1 disposed on the second wiring layer 131 of the substrate 13 directly, a wiring layer is omitted. It has the advantages of reducing the producing processes, the materials and the costs. By disposing the capacitor C1 on the substrate 13 of the package body 10, the current-path length of the high-frequency control loop is reduced, so that the stray inductance is reduced, and the reliability of the module is improved. Moreover, in the embodiment, the output bus O is connected by a thick conductive metal strip. It has the effect of increasing the cross-sectional area of the current path of the second high-frequency loop, reducing the resistance and reducing the loss. Furthermore, preferably but not exclusively, the output bus O is directly connected to the first wiring layer 20 by means of a thick conductive metal strip by welding. The connection method is simple and reliable.

Figure 27:
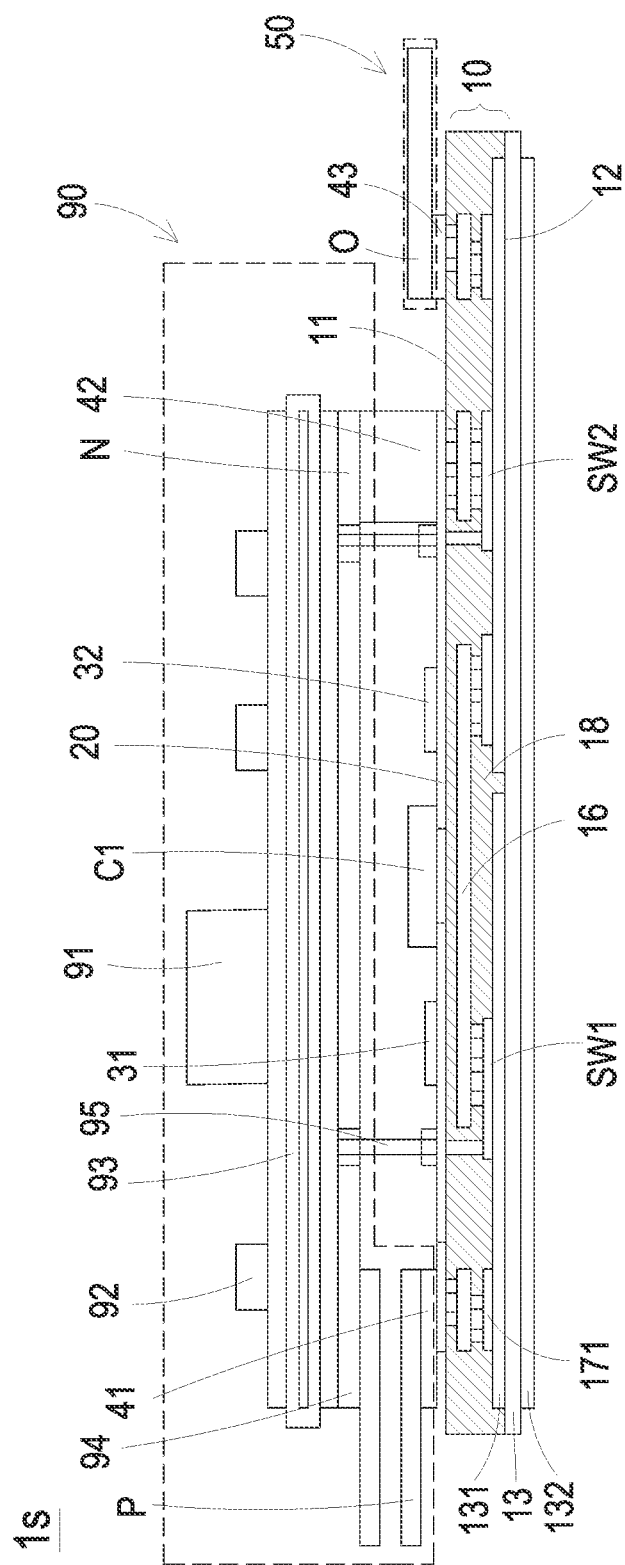
FIG. 27 is a schematic cross-sectional view illustrating the power module assembly according to a nineteenth embodiment of the present disclosure.

FIG. 27 is a schematic cross-sectional view illustrating the power module assembly according to a nineteenth embodiment of the present disclosure. In the embodiment, the structures, elements and functions of the power module assembly is are similar to those of the power module 1 of FIG. 1 and FIGS. 6A and 6B, and are not redundantly described herein. In the embodiment, the power module assembly is further includes a carrier board 93 and a control circuit (not shown). The carrier board 93 is disposed above at least one of the negative-electrode bus N and the positive-electrode bus P. Preferably but not exclusively, the control circuit is disposed on the carrier board 93 and configured to control the first switch SW1 and the second switch SW2. The control circuit on the carrier board 93 is connected to the first switch SW1 and the second switch SW2 through the system bus set 50. Preferably but not exclusively, in the embodiment, the carrier board 93 is a multilayer-insulated-metal substrate, and the power module assembly is further include a control chip 91 and a detection component 92 disposed on the carrier board 93. The control chip 91 is configured to provide the aforementioned control circuit, and the detection component 92 is configured to provide a detection circuit. In the embodiment, the control circuit provided by the control chip 91 is electrically connected to the two driving components 31 and 32. The two driving components 31 and 32 disposed on the first wiring layer 20 are electrically connected to the first switch SW1 and the second switch SW2, respectively. The two driving components 31 and 32 receive control signals outputted from the control circuit, and output driving signals for controlling the first switch SW1 and the second switch SW2. Moreover, in the embodiment, the negative-electrode bus N of the system bus set 50 further includes a thick copper layer 94. Preferably but not exclusive, the thick copper layer 94 is disposed on the lower surface of the carrier board 93 and is electrically connected to the negative-electrode extension part 42. In the embodiment, the control circuit provided by the control chip 91 and the detection circuit provided by the detection component 92 are connected to the corresponding device in the power module assembly 1s through the connecting component 95. Preferably but not exclusively, in the embodiment, the connecting component 95 is a pin header, a copper pillar, a pogo pin, or a soft metal wire.

Figure 28:
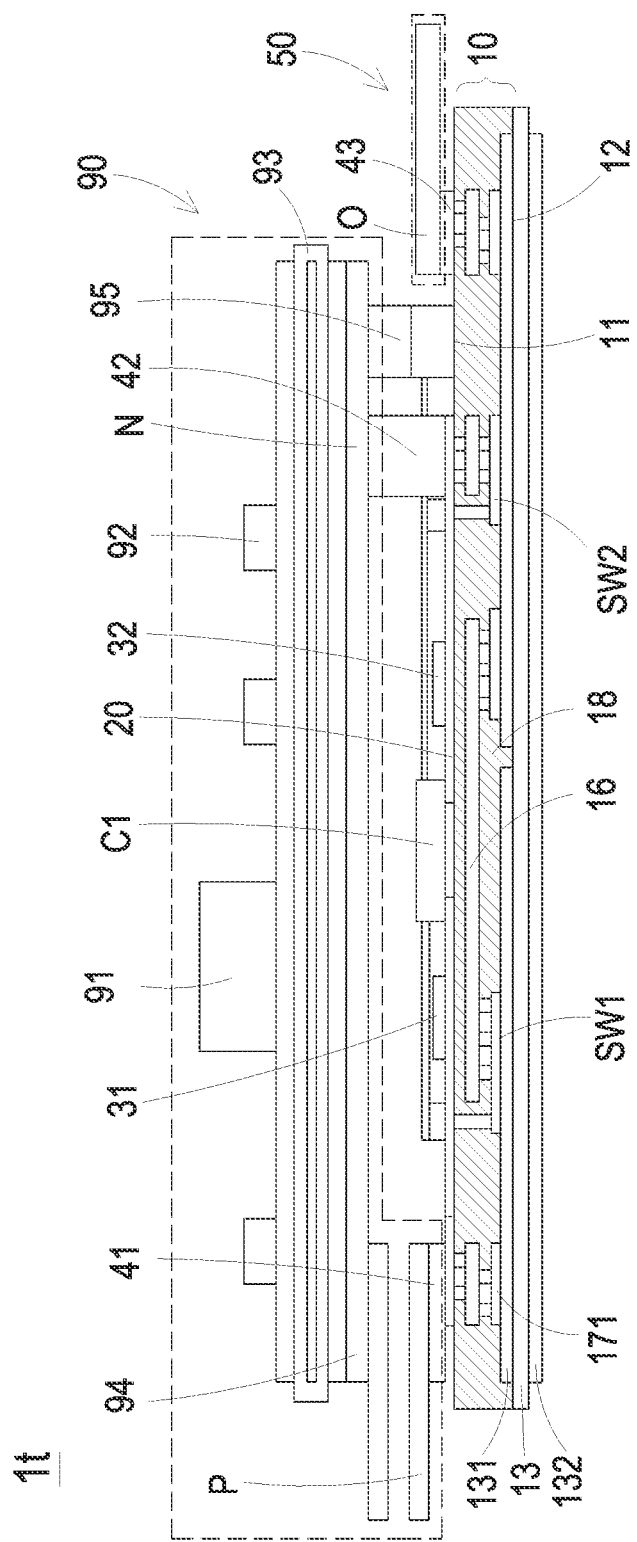
FIG. 28 is a schematic cross-sectional view illustrating the power module assembly according to a twentieth embodiment of the present disclosure.

FIG. 28 is a schematic cross-sectional view illustrating the power module assembly according to a twentieth embodiment of the present disclosure. In the embodiment, the power module assembly 1t includes a connecting component 95 configured to connect the control chip 91 and the detection component 92 with the corresponding devices in the power module assembly 1t for communication control. Moreover, in this embodiment, the lower surface of the carrier board 93 is electrically connected to the thick copper layer 94 of the negative-electrode bus N. The projection of the thick copper layer 94 of the negative-electrode bus N on the first surface 11 is at least partially overlapped with the projection of the first switch SW1 and the second switch SW2 connected in series on the first surface 11. In the embodiment, the thick copper layer 94 of the negative-electrode bus N further forms a shielding layer between the control circuit provided by the control chip 91 and the output bus O. It achieves a good suppression for the electromagnetic interference. Preferably but not exclusively, in other embodiments, the control chip 91 and the detection component 92 disposed on the carrier board 93 are integrated into one piece with the carrier board 93 by molding. It is beneficial for realizing the modularization and reducing the cost.

Figure 29A:
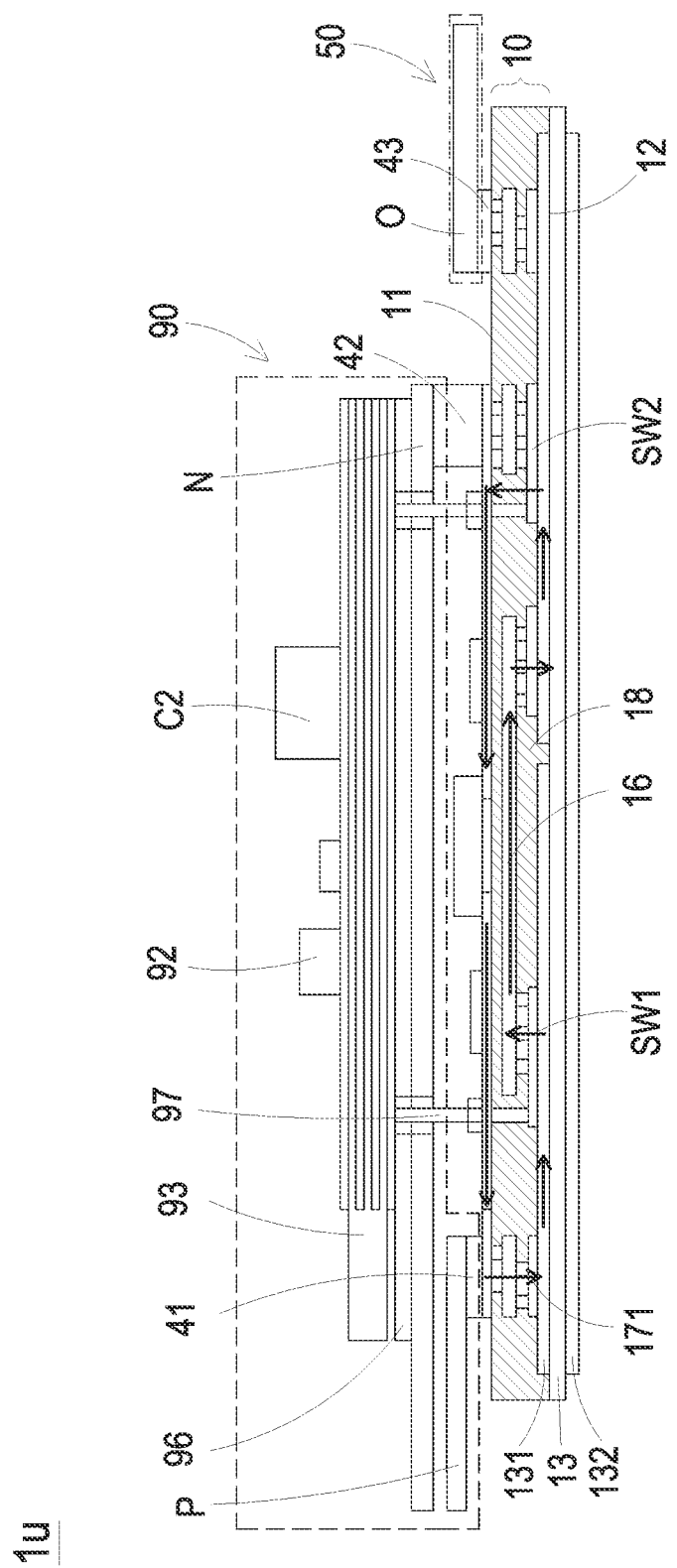
FIG. 29A is a schematic cross-sectional view illustrating the current flow of the first high-frequency loop of the power module assembly according to a twenty-first embodiment of the present disclosure.
Figure 29B:
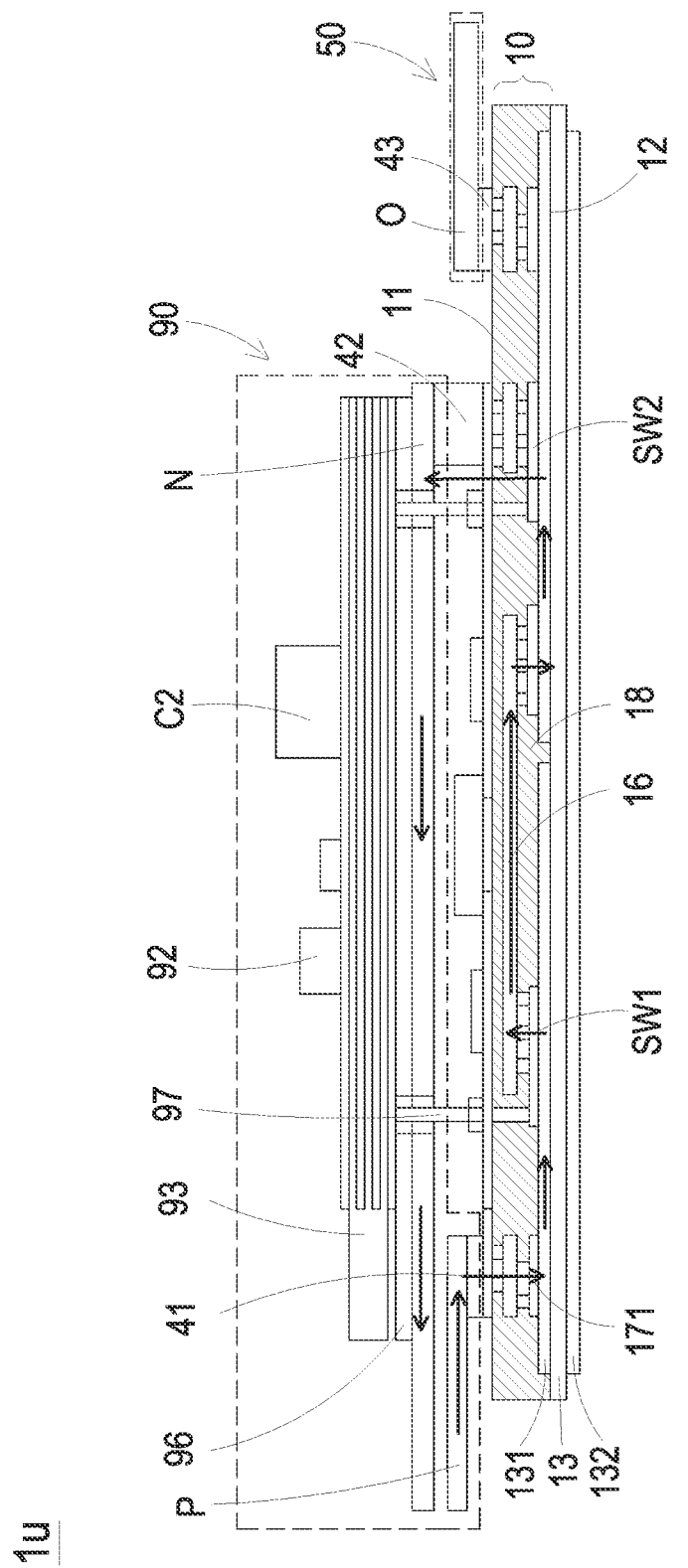
FIG. 29B is a schematic cross-sectional view illustrating the current flow of the second high-frequency loop of the power module assembly according to the twenty-first embodiment of the present disclosure.

FIG. 29A is a schematic cross-sectional view illustrating the current flow of the first high-frequency loop of the power module assembly according to a twenty-first embodiment of the present disclosure. FIG. 29B is a schematic cross-sectional view illustrating the current flow of the second high-frequency loop of the power module assembly according to the twenty-first embodiment of the present disclosure. In the embodiment, the structures, elements and functions of the power module assembly 1u are similar to those of the power module is of FIG. 27, and are not redundantly described herein. In the embodiment, the power module assembly 1u further includes a system capacitor C2 in addition to the control circuit and detection component 92 disposed on the carrier board 93. Preferably but not exclusively, the detection component 92 and the system capacitor C2 are disposed on the carrier board 93 through the surface mount technology (SMT), and the carrier board 93 is bonded to the negative-electrode bus N through an adhesive 96. In that, the functions of the driving control and the voltage detection are integrated. The adhesive 96 is helpful for making the assembling more convenient and more efficient. In the embodiment, the detection component 92 on the carrier board 93 is further connected to the control electrode of the power module assembly 1u through the connecting component 97. Preferably but not exclusively, the connecting component 97 is a pin header, a copper pillar, a pogo pin or a soft metal wire. Preferably but not exclusively, in other embodiments, the carrier board 93, the detection components 92, and the system capacitor C2 are integrated into one piece with the carrier board 93 by molding. It is beneficial for realizing the modularization and reducing the cost.

Figure 30A:
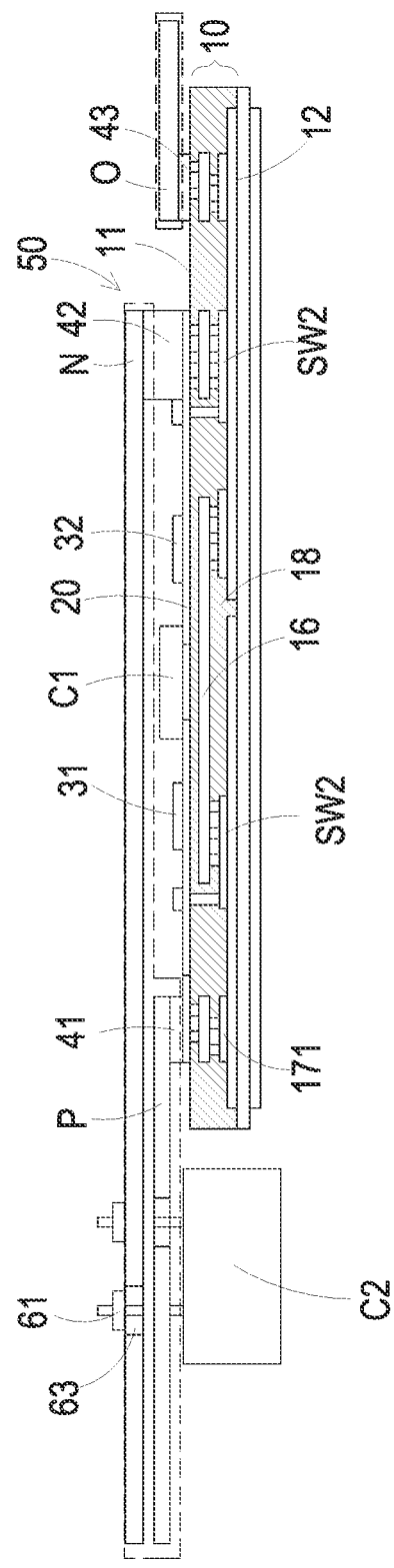
FIG. 30A is a schematic cross-sectional view illustrating the power module assembly according to a twenty-second embodiment of the present disclosure.
Figure 30B:
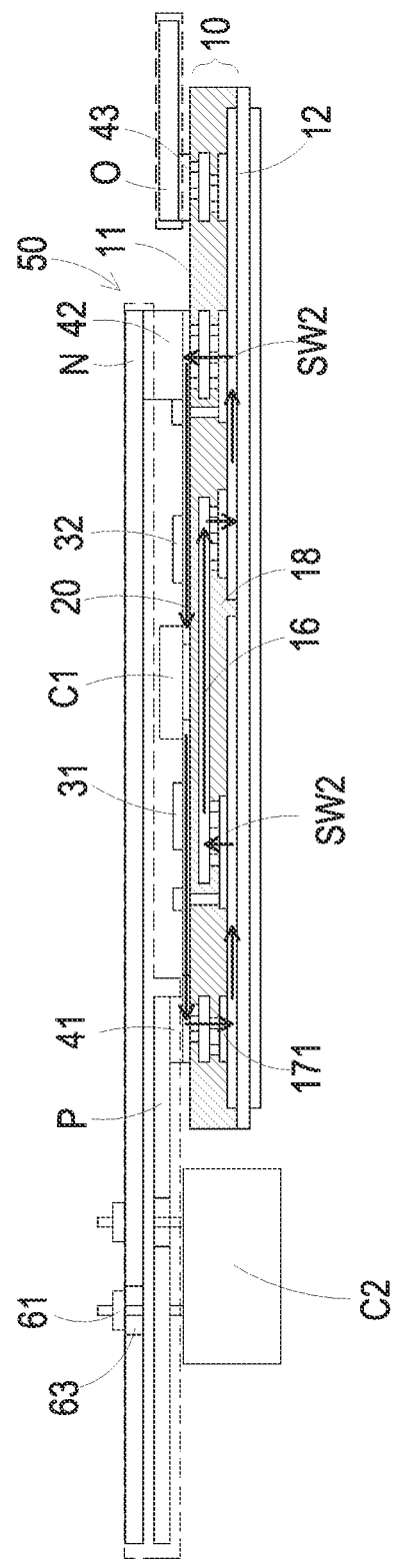
FIG. 30B is a schematic cross-sectional view illustrating the current flow of the first high-frequency loop of the power module assembly according to the twenty-second embodiment of the present disclosure.
Figure 30C:
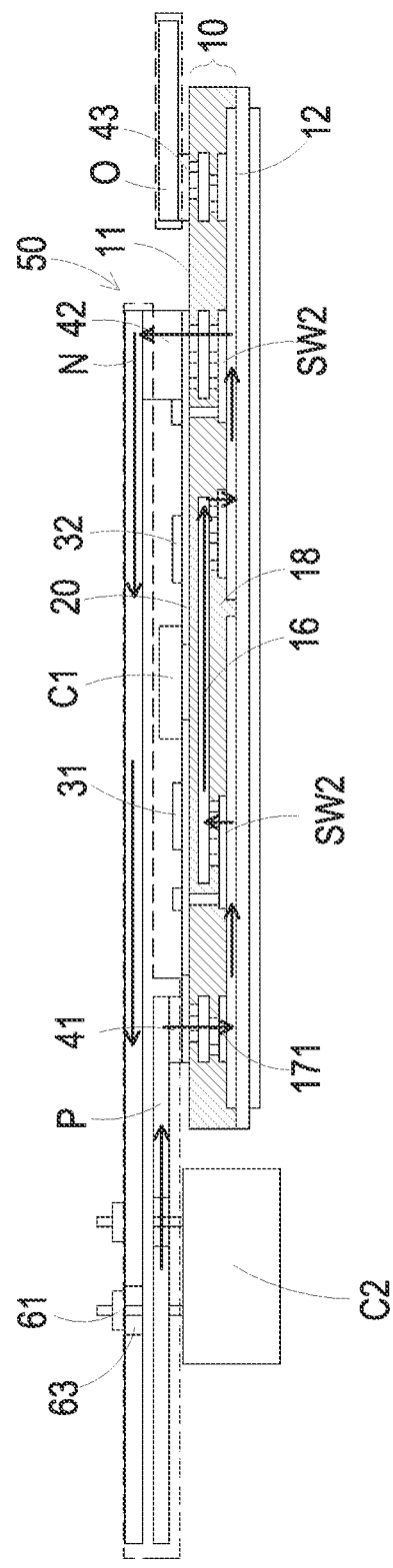
FIG. 30C is a schematic cross-sectional view illustrating the current flow of the second high-frequency loop of the power module assembly according to the twenty-second embodiment of the present disclosure.

FIG. 30A is a schematic cross-sectional view illustrating the power module assembly according to a twenty-second embodiment of the present disclosure; In the embodiment, the structures, elements and functions of the power module assembly 1v are similar to those of the power module 1u of FIGS. 29A and 29B, and are not redundantly described herein. In the embodiment, the positive electrode and the negative electrode of the system capacitor C2 are connected to the positive-electrode extension part 41 and the negative-electrode extension part 42 of the power module assembly 1v directly. Since the positive electrode and the negative electrode of the system capacitor C2 protrude from the top and are directly connected to the positive-electrode bus P and the negative-electrode bus N of the power module assembly 1v, the system capacitor C2 is disposed close to the power module assembly 1v. It is helpful for reducing the parasitic inductance. In other embodiments, with the use of laser welding instead of the connection method of the screw 61 and the insulating bushing 63, it is further helpful for reducing the installation steps, reducing the cost, reducing the overall size of the system, and increasing the power density at system level. Moreover, preferably but not exclusively, in the example, the system capacitor C2 is a film capacitor with a relatively large capacitance value. The system capacitor C2 is connected to the positive-electrode bus P and the negative-electrode bus N to absorb the loop oscillation caused by the first switch SW1 and the second switch SW2. Certainly, the present disclosure is not limited thereto, and not redundantly described herein.

From the above descriptions, the present disclosure provides a power module assembly. By optimizing the arrangement of each component, the purpose of reducing the parasitic inductance and the EMI is achieved. It facilitates the power module assembly to be assembled easily and firmly. At same time, it is beneficial to reduce the volume of the power module and improve the entire power density of the power module. Two switches are connected in series to form a bridge arm embedded in a package body. By partially overlapping the projection of the system bus set on the surface of the package body and the projection of the two series-connection switches on the surface of the package body, a first high-frequency loop and a second high-frequency circuit decoupled from each other are formed. The current of the first high-frequency loop flows through the first wiring layer on the surface of the package body. However, the current path of the second high-frequency loop crosses through the first wiring layer on the surface of the package body, and its current that flows through the first wiring layer in the horizontal direction can be ignored. At least, the current paths of the two high-frequency loops are partially decoupled, and the mutual influence is eliminated. Furthermore, the first wiring layer on the surface of the package body can be realized with a thinner thickness, and the package body can be assembled with the system bus set to reduce the manufacturing costs and minimize the thickness of the entire structure. Moreover, the filling of the insulation material layer in the package body is improved, and the reliability of the product is enhanced. In addition, when the capacitor of the power module assembly is directly arranged outside the package body, it is beneficial for simplifying the assembly structure, reducing the cost, simplifying the manufacturing process, and improving the yield and reliability of the product. By partially overlapping the projection of the system bus set on the surface of the package body and the projection of the two series-connection switches on the surface of the package body, the first high-frequency loop and the second high-frequency loop formed in the power module assembly are decoupled from each other, and the parasitic inductances of the first high-frequency loop and the second high-frequency loop are eliminated. It is easy to realize the connection process of the system bus set with the bridge arm including the two series-connection switches. It is beneficial for reducing the cost and enhancing the reliability. A better shielding for the control circuit on the system side is provided by the system bus set, and it facilitates the power module assembly to reduce the EMI. Moreover, since the system bus set is fanned out on the same side of the power module assembly, and assembled with the bridge arm including two series-connection switches, it facilities the power module assembly to combine with two heat dissipation modules to achieve the double-side heat dissipation and reduce the thermal resistance. Furthermore, the purposes of reducing the costs, enhancing the reliability of the power module and improving the heat-dissipation capacity are achieved.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module assembly, comprising:
   a package body comprising a first surface, a second surface, a first switch and a second switch, wherein the first surface and the second surface are opposite to each other, and the first switch and the second switch are embedded between the first surface and the second surface and connected to each other in series to form a bridge arm;
   a first wiring layer disposed on the first surface of the package body;
   a capacitor connected in parallel with the bridge arm to form a first high-frequency loop; and
   a system bus set comprising a positive-electrode bus and a negative-electrode bus fanned out from the first surface of the package body, respectively, wherein a projection of the positive-electrode bus or/and the negative-electrode bus on the first surface is at least partially overlapped with a projection of the first switch or/and the second switch on the first surface, and the projection of the positive-electrode bus or/and the negative-electrode bus on the first surface is at least partially overlapped with a projection of the capacitor on the first surface, wherein the bridge arm is electrically connected between the positive-electrode bus and the negative-electrode bus to form a second high-frequency loop.

2. The power module assembly according to claim 1, wherein the capacitor is disposed on the first wiring layer and located outside the package body, and the capacitor is connected to the first switch and the second switch through the first wiring layer.

3. The power module assembly according to claim 1, wherein the first switch and the second switch both comprise a first end, a second end, and a third end.

4. The power module assembly according to claim 3, further comprising two driving components disposed on the first wiring layer and electrically connected to the first end and the second end of the first switch and the first end and the second end of the second switch, respectively.

5. The power module assembly according to claim 3, further comprising a substrate, wherein the substrate comprises a second wiring layer, the second wiring layer is disposed in the package body, and the first switch and the second switch are disposed on the second wiring layer.

6. The power module assembly according claim 5, wherein the first switch and the second switch are both vertical devices, the third end of the first switch faces the first surface, the second end of the second switch faces the first surface, and the second end of the first switch is electrically connected to the third end of the second switch through the second wiring layer.

7. The power module assembly according to claim 3, wherein the package body comprises a third wiring layer disposed between the first surface and the first switch and between the first surface and the second switch, and the second end of the first switch is electrically connected to the third end of the second switch through the third wiring layer.

8. The power module assembly according to claim 7, wherein the first switch and the second switch are both planar devices.

9. The power module assembly according to claim 7, wherein the thickness of the first wiring layer is less than the thickness of the third wiring layer.

10. The power module assembly according to claim 7, wherein the third wiring layer is a copper strip embedded in the package body.

11. The power module assembly according to claim 3, further comprising a metal conductive strip disposed on the first surface of the package body, wherein the second end of the first switch is electrically connected to the third end of the second switch through the metal conductive strip.

12. The power module assembly according to claim 11, wherein a projection of the metal conductive strip on the first surface and the projection of the positive-electrode bus and/or the negative-electrode bus on the first surface are at least partially overlapped.

13. The power module assembly according to claim 11, wherein the metal conductive strip comprises a slot, and the capacitor is accommodated in the slot.

14. The power module assembly according to claim 3, further comprising a carrier board and a control circuit, wherein the carrier board is disposed on at least one of the negative-electrode bus and the positive-electrode bus, and the control circuit is disposed on the carrier board to control the first switch and the second switch.

15. The power module assembly according to claim 14, further comprising two driving components disposed on the first wiring layer, wherein the two driving components receive a control signal outputted from the control circuit and output a driving signal to control the first switch and the second switch.

16. The power module assembly according to claim 1, further comprising a positive-electrode extension part and a negative-electrode extension part disposed on the first surface of the package body, wherein the positive-electrode extension part is connected to the positive-electrode bus, the negative-electrode extension part is connected to the negative-electrode bus, the positive-electrode bus and the negative-electrode bus is parallel to the first surface, and the projection of the positive-electrode bus on the first surface and the projection of the negative-electrode bus on the first surface are at least partially overlapped.

17. The power module assembly according to claim 16, wherein the system bus set comprises an output bus electrically connected to a midpoint of the bridge arm, wherein the output bus is parallel to the positive-electrode bus and the negative-electrode bus, and a projection of the output bus on the first surface and the projection of the positive-electrode bus and/or the negative-electrode bus on the first surface are at least partially overlapped.

18. The power module assembly according to claim 17, further comprising an output extension part disposed on the first surface of the package body, wherein the output extension part is connected to the output bus, wherein the system bus set comprises flexible insulators disposed between the positive-electrode bus and the negative-electrode bus, and between the negative-electrode bus and the output bus to compensate a dimensional tolerance caused by the height differences of the positive-electrode extension part, the negative-electrode extension part and the output extension part.

19. The power module assembly according to claim 1, further comprising a heat dissipation module and a thermal-conductive insulating layer, wherein the heat dissipation module is thermally coupled to the system bus set through the thermal-conductive insulating layer.

20. The power module assembly according to claim 1, further comprising a system capacitor electrically connected between the positive-electrode bus and the negative-electrode bus.

* * * * *